US006784080B2

(12) United States Patent
Mizuno et al.

(10) Patent No.: US 6,784,080 B2
(45) Date of Patent: Aug. 31, 2004

(54) METHOD OF MANUFACTURING SEMICONDUCTOR DEVICE BY SPUTTER DOPING

(75) Inventors: Bunji Mizuno, Nara (JP); Hiroaki Nakaoka, Kyoto (JP); Michihiko Takase, Nara (JP); Ichiro Nakayama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 190 days.

(21) Appl. No.: 09/840,306

(22) Filed: Apr. 24, 2001

(65) Prior Publication Data

US 2003/0166328 A1 Sep. 4, 2003

Related U.S. Application Data

(60) Continuation-in-part of application No. 09/178,766, filed on Oct. 26, 1998, now abandoned, which is a division of application No. 08/734,218, filed on Oct. 21, 1996, now Pat. No. 6,217,951.

(30) Foreign Application Priority Data

Oct. 23, 1995 (JP) .............................................. 7-274234

(51) Int. Cl.[7] .............................................. H01L 21/04
(52) U.S. Cl. ...................................... 438/510; 438/513
(58) Field of Search ........................ 118/723 E, 723 ER, 118/723 MP; 204/192.12, 192.17, 192.25, 192.29, 298.05, 298.11, 298.26; 427/523, 524, 530, 531; 438/510, 513, 536, 558

(56) References Cited

U.S. PATENT DOCUMENTS

| 3,461,054 A | 8/1969 | Vratny |
| 3,732,158 A | 5/1973 | Przybyszewski et al. |
| 4,013,533 A | 3/1977 | Cohen-Solal et al. |
| 4,108,751 A | 8/1978 | King |
| 4,596,645 A | 6/1986 | Stirn |
| 4,874,497 A | 10/1989 | Matsuoka et al. |
| 5,085,885 A | 2/1992 | Foley et al. |
| 5,320,984 A | 6/1994 | Zhang et al. |
| 5,607,509 A | 3/1997 | Schumacher et al. |
| 5,672,541 A | 9/1997 | Booske et al. |
| 5,673,541 A | 10/1997 | Arzuman et al. |
| 5,789,292 A | * 8/1998 | Yamazaki et al. .......... 438/257 |

FOREIGN PATENT DOCUMENTS

| CH | 625 641 | | 9/1981 |
| CN | 1154569 | * | 7/1997 |
| DE | 40 02 269 | | 8/1990 |

(List continued on next page.)

OTHER PUBLICATIONS

Silicon Processing for the VLSI Era by Wolf, vol. 2, Chapter 2, Lattice Press, California, 1990.*
Bunshah, "Deposition Technologies for films and coatings" Chapter 5, pp. 170–237, Noyes publications, 1982.*
Greiner et al., "RF Sputtering Technique", IBM Technical Disclosure Bulletin, vol. 17, No. 7, pp. 2172–2173.

(List continued on next page.)

Primary Examiner—Evan Pert
Assistant Examiner—Asok Kumar Sarkar
(74) Attorney, Agent, or Firm—McDermott, Will & Emery

(57) ABSTRACT

A semiconductor substrate and an impurity solid that comprises of impurity to be introduced to a diode formation region are held in a vacuum chamber. Inert or reactive gas is introduced into the vacuum chamber to generate plasma composed of the inert or reactive gas. A first voltage allowing the impurity solid to serve as a cathode for the plasma is applied to the said impurity solid and the said impurity solid is sputtered by ions in the plasma, thereby mixing the impurity within the said impurity solid into the plasma. A second voltage allowing a semiconductor substrate to serve as a cathode for the plasma is applied to the said semiconductor substrate, thereby directly introducing the impurity within the plasma to the surface portion of the diode formation region of the said semiconductor substrate, generating a impurity layer.

50 Claims, 10 Drawing Sheets

FOREIGN PATENT DOCUMENTS

| | | | |
|---|---|---|---|
| EP | 0 582 228 | | 2/1994 |
| EP | 0 711 020 | | 5/1997 |
| JP | 62179716 | | 8/1987 |
| JP | 01185918 | | 7/1989 |
| JP | 5-24976 | | 2/1993 |
| JP | 05134277 | | 5/1993 |
| JP | 05343322 | | 12/1993 |
| JP | 9-115851 | | 5/1997 |
| KR | 97-23693 | * | 5/1997 |
| TW | 346645 | * | 12/1998 |
| WO | 92/05896 | | 4/1996 |

OTHER PUBLICATIONS

Johnson et al., "Solid–Source Doping of a–Si:H Thin Films Deposited with a remote Hydrogen Plasma", Journal of Non–Crystalline Solids 114. pp. 169–171 (Dec. 1989).

Mizuno et al., "New Methods for Ultra–Shallow Boron Doping by Using Plasma, Plasma–Less and Sputtering", International Conf. on Solid State Devices and Materials. pp. 1041–1042 (Aug. 1995).

Cheung. "Plasma Immersion Ion Implantation for ULSI Processing", Nuclear Instruments & Methods In Physics Research. Section B: Beam Interactions with Materials and Atoms. vol. B55. No. 1/4 (Apr. 1991).

Gibilisco. "Encyclopedia of Electronics", TAB Professional and Reference Books, pp. 30–31 (1985).

K.C. Walter et al., Materials Research Bulletin. 29 (1994) 827.

* cited by examiner

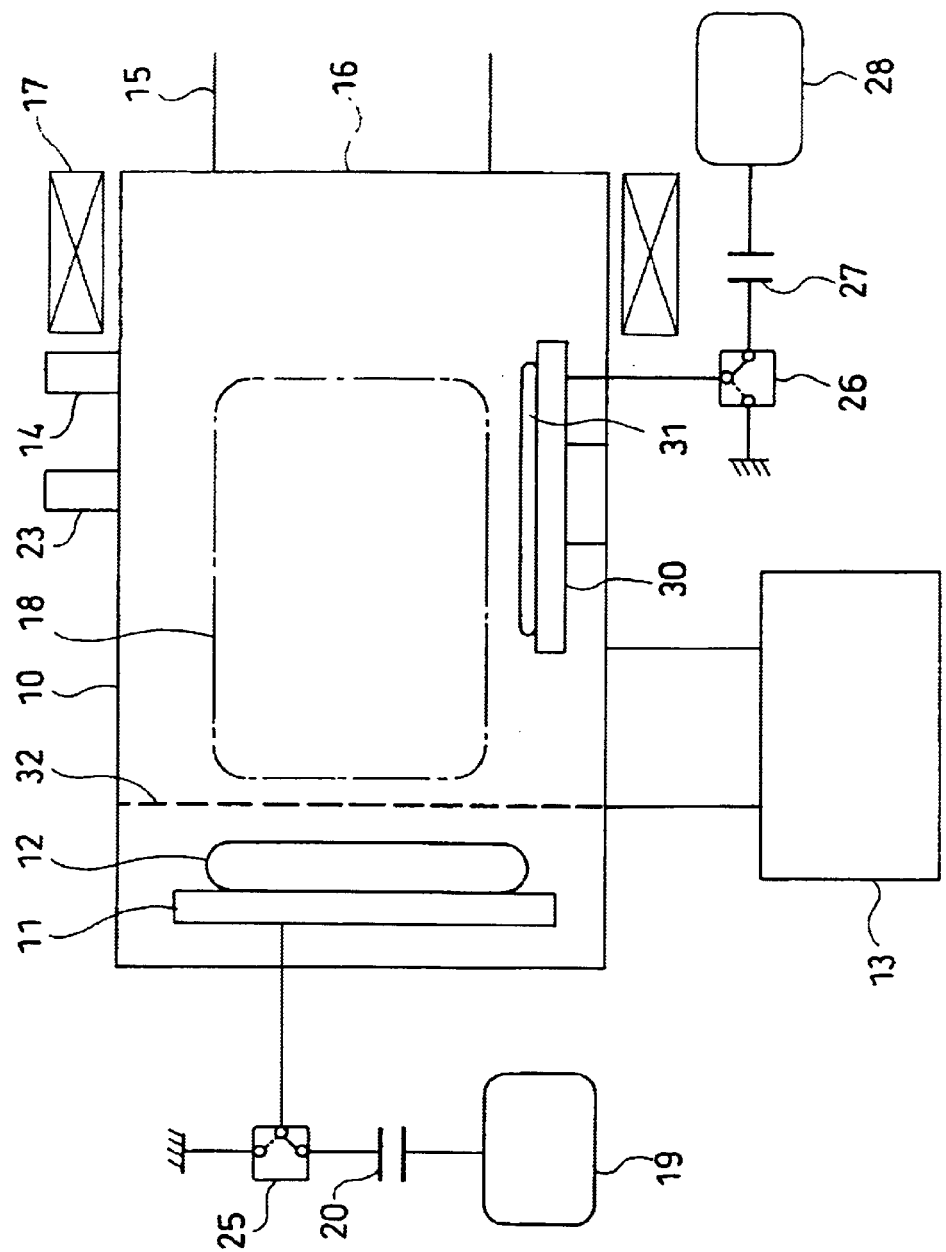

METHOD OF MANUFACTURING SEMICONDUCTOR DEVICE BY SPUTTER DOPING

The application is a Continuation-In-Part of U.S. patent application Ser. No. 09/178,766, filed Oct. 26, 1998, now abandoned, which is a Divisional of U.S. patent application Ser. No. 08/734,218, filed Oct. 21, 1996, now U.S. Pat. No. 6,217,951, the disclosures of which are incorporated herein by reference.

BACKGROUND OF THE INVENTION

The present invention relates to impurity introduction methods and apparatuses thereof to introduce, in a low temperature range (temperature range of, for example, 250° C. to very low temperature), impurity composed of atoms and molecules to a surface portion of a solid sample such as a semiconductor substrate, and also relates to manufacturing methods of a semiconductor device using such impurity introduction method.

As a technique to introduce impurity to the surface portion of the solid sample, plasma doping method in which impurity is ionized and introduced to a solid with low energy is known as disclosed in, for example, U.S. Pat. No. 4,912,065.

Now, a plasma doping method will be described below as a conventional impurity introduction method with reference to FIG. 8.

FIG. 8 illustrates a schematic structure of an impurity introduction apparatus used for the conventional plasma doping. FIG. 8 shows a vacuum chamber 10, a sample holder 11 provided inside the vacuum chamber 10 for holding a solid sample 12 which is composed of a silicon substrate or the like and to which impurity is introduced, a pressure reducing pump 13 for reducing the pressure inside the vacuum chamber 10, a source gas feed 14 for supplying doping gas including a desired element, such as $B_2H_6$, to the vacuum chamber 10, a microwave guide 15 connected to the vacuum chamber 10, a quartz plate 16 provided between the vacuum chamber 10 and the microwave guide 15, and an electromagnet 17 arranged outside the vacuum chamber 10. The microwave guide 15, the quartz plate 16 and the electromagnet 17 constitute plasma generation means. In FIG. 8, a plasma region 18 and a high-frequency power supply 19 connected to the sample holder 11 through a capacitor 20 are also shown.

In the impurity introduction apparatus having the structure above, the doping gas such as $B_2H_6$ introduced from the source gas feed 14 is made into plasma by the plasma generation means, and boron ions in the plasma are introduced to the surface portion of the solid sample 12 by the high-frequency power supply 19.

After a metal interconnection layer is formed on the solid sample 12 having thus introduced impurity, a thin oxide film is formed on the metal interconnection layer in the prescribed oxidizing atmosphere. There-after, a gate electrode is formed on the solid sample 12 by a CVD device or the like to obtain, for example, a MOS transistor.

There is a problem that in general the gas including the impurity which becomes electrically active when introduced to the solid sample such as a silicon substrate, such as the doping gas composed of $B_2H_6$, is highly dangerous.

In addition, under the plasma doping method, all the substances included in the doping gas are introduced to the solid sample. Taking as an example the doping gas composing $B_2H_6$, although only boron is the effective impurity when introduced to the solid sample, hydrogen is also introduced to the solid sample at the same time. If hydrogen is introduced to the solid sample, a lattice defect is undesirably generated at the solid sample during the thermal treatment such as epitaxial growth performed thereafter.

Therefore, the inventors of the present invention have conceived that an impurity solid including the impurity which becomes electrically active when introduced to the solid sample is arranged in the vacuum chamber, and plasma of rare gas as inert or reactive gas is generated in the vacuum chamber and the impurity solid is sputtered by ions of the rare gas so that the impurity is separated from the impurity solid.

FIG. 9. shows a schematic structure of an impurity introduction apparatus used for plasma doping which utilizes an impurity solid including impurity. The elements in FIG. 9 identical to those in FIG. 8 are denoted by the identical numerals and description thereof will not be repeated.

This impurity introduction apparatus is characterized in that the device is provided with a solid holder 22 for holding an impurity solid 21 including impurity such as boron and a rare gas feed 23 for introducing rare gas into the vacuum chamber 10. When gas such as Ar gas is introduced into the vacuum chamber 10 from the rare gas feed 23, the Ar gas is made into plasma by the plasma generation means and boron is sputtered from the impurity solid 21 by the Ar ions in the Ar plasma. Boron thus sputtered is mixed into the Ar plasma to become plasma doping gas and then introduced to the surface portion of the solid sample 12.

However, although it is true that impurity is generated from the impurity solid 21 when the plasma doping is carried out as described above, problems still remain that throughput is not satisfactory because the amount of impurity generated is not sufficient and that the impurity cannot be introduced to the region extremely close to the surface at the surface portion of the solid sample.

SUMMARY OF THE INVENTION

In view of the above, a first object of the present invention is to improve throughput by increasing the amount of impurity generated when inert or reactive gas is introduced into a vacuum chamber to generate impurity from an impurity solid, and a second object thereof is to achieve introduction of the impurity to the region extremely close to the surface at the surface portion of a solid sample.

In order to achieve the first object, a first impurity introduction method according to the present invention comprises the steps of: holding, in a vacuum chamber, an impurity solid which includes impurity and a solid sample into which impurity is introduced; introducing inert or reactive gas into the vacuum chamber to generate plasma composed of the inert or reactive gas; applying to the impurity solid a voltage which allows the impurity solid to serve as a cathode for the plasma, and performing sputtering of the impurity solid by ions in the plasma, so that the impurity included in the impurity solid is mixed into the plasma; and applying to the solid sample a voltage allowing the solid sample to serve as a cathode for the plasma to introduce the impurity mixed into the plasma to the surface portion of the solid sample.

According to the first impurity introduction method, the ions in the plasma advance toward the impurity solid with great energy when the voltage allowing the impurity solid to serve as a cathode for the plasma is applied to the impurity solid, so that the impurity included in the impurity solid is sputtered efficiently and mixed with high concentration into the plasma composed of the inert or reactive gas. Furthermore, since the high-concentration impurity ions mixed into the plasma advance toward the solid sample with great energy when the voltage allowing the solid sample to serve as a cathode for the plasma is applied to the solid sample, the high-concentration impurity ions are introduced to the surface portion of the solid sample. Thus, a high-concentration impurity layer can be formed with high safety without causing a lattice defect at the surface portion of the solid sample.

In order to achieve the first and second objects above, a second impurity introduction method according to the present invention comprises the steps of: holding, in a vacuum chamber, an impurity solid which includes impurity and a solid sample into which impurity is introduced; introducing inert or reactive gas into the vacuum chamber to generate plasma composed of the inert or reactive gas; applying to the impurity solid a voltage allowing the impurity solid to serve as a cathode for the plasma, and performing sputtering of the impurity solid by ions in the plasma, so that the impurity included in the impurity solid is mixed into the plasma; and applying to the solid sample a voltage allowing the solid sample to serve as an anode for the plasma to introduce the impurity mixed into the plasma to the solid sample.

According to the second impurity introduction method, the ions in the plasma advance toward the impurity solid with great energy when the voltage allowing the impurity solid to serve as a cathode for the plasma is applied to the impurity solid, so that the impurity included in the impurity solid is sputtered efficiently and mixed with high concentration into the plasma composed of the inert or reactive gas. Furthermore, since the high-concentration impurity ions mixed into the plasma advance toward the solid sample with small energy when the voltage allowing the solid sample to serve as an anode for the plasma is applied to the solid sample, the high-concentration impurity ions are introduced to a region extremely close to the surface at the surface portion of the solid sample. Therefore, a high-concentration impurity layer can be formed with high safety at the region extremely close to the surface at the surface portion of the solid sample without causing a lattice defect at the solid sample.

In order to achieve the second object above, a third impurity introduction method according to the present invention comprises the steps of: holding, in a vacuum chamber, an impurity solid which includes impurity and a solid sample into which impurity is introduced; introducing inert or reactive gas into the vacuum chamber to generate plasma composed of the inert or reactive gas; applying to the impurity solid a voltage allowing the impurity solid to serve as an anode for the plasma, and performing sputtering of the impurity solid by ions in the plasma, so that the impurity included in the impurity solid is mixed into the plasma; and applying to the solid sample a voltage allowing the solid sample to serve as an anode for the plasma to introduce the impurity mixed into the plasma to the solid sample.

According to the third impurity introduction method, the ions in the plasma advance toward the impurity solid with small energy when the voltage allowing the impurity solid to serve as an anode for the plasma is applied to the impurity solid, so that a relatively small amount of the impurity included in the impurity solid is sputtered and mixed with low concentration into the plasma composed of the inert or reactive gas. Furthermore, since the low-concentration impurity ions mixed into the plasma advance toward the solid sample with small energy when the voltage allowing the solid sample to serve as an anode for the plasma is applied to the solid sample, the low-concentration impurity ions are introduced to a region extremely close to the surface at the surface portion of the solid sample. Therefore, a low-concentration impurity layer can be formed with high safety at the region extremely close to the surface at the surface portion of the solid sample without causing a lattice defect at the solid sample.

In order to achieve the first object above, a fourth impurity introduction method according to the present invention comprises the steps of: in the vacuum chamber, providing impurity deposition means onto which impurity is deposited and holding a solid sample into which impurity is introduced; blocking in the vacuum chamber a first region, where the impurity deposition means is provided, and a second region, where the solid sample is held, from each other and then introducing gas including the impurity to the first region to form an impurity film composed of the impurity at the impurity deposition means; allowing the first and second regions to communicate with each other and then introducing inert or reactive gas into the vacuum chamber to generate plasma composed of the inert or reactive gas; applying to the impurity film a voltage allowing the impurity film to serve as a cathode for the plasma and performing sputtering of the impurity film by ions in the plasma to mix the impurity included in the impurity film into the plasma composed of the inert or reactive gas; and applying to the solid sample a voltage allowing the solid sample to serve as a cathode for the plasma to introduce the impurity mixed into the plasma to the surface portion of the solid sample.

According to the fourth impurity introduction method, when the gas including the impurity is introduced to the first region where the impurity deposition means is provided in the vacuum chamber after the first region and the second region where the solid sample is held in the vacuum chamber are blocked from each other, impurity is deposited to the impurity deposition means to form an impurity film composed of the impurity. Then, after the first and second regions are allowed to communicate with each other, the plasma composed of the inert or reactive gas is generated inside the vacuum chamber and the voltage allowing the impurity film to serve as a cathode for the plasma is applied to the impurity film, whereby, as described above, the impurity included in the impurity film is efficiently sputtered and mixed with high concentration into the plasma composed of the inert or reactive gas. In addition, when the voltage allowing the solid sample to serve as a cathode for the plasma is applied to the solid sample, the high-concentration impurity ions are introduced to the surface portion of the solid sample, as described above. Therefore, a high-concentration impurity layer can be formed at the surface portion of the solid sample without generating a lattice defect at the solid sample.

In the first, second or fourth impurity introduction method, the voltage allowing the function to serve as a cathode for the plasma is preferably a negative voltage, and in the second or third impurity introduction method, the voltage allowing the function to serve as an anode for the plasma is preferably a voltage of 0 V or lower.

In the first through fourth impurity introduction methods, preferably, the solid sample is a semiconductor substrate composed of silicon, the impurity is arsenic, phosphorus, boron, aluminum, antimony, gallium, or indium, and the inert or reactive gas is the gas including nitrogen or argon.

A first impurity introduction apparatus according to the present invention comprises a vacuum chamber of which inside is kept vacuum, solid holding means provided in the vacuum chamber for holding an impurity solid which includes impurity, sample holding means provided in the vacuum chamber for holding a solid sample to which impurity is introduced, plasma generating means for generating plasma in the vacuum chamber, gas introducing means for introducing inert or reactive gas into the vacuum chamber, first voltage applying means for applying to the solid holding means a voltage allowing the impurity solid to serve as a cathode for the plasma, and second voltage applying means for applying to the sample holding means a voltage allowing the solid sample to serve as a cathode for the plasma.

In the first impurity introduction apparatus, when the voltage allowing the impurity solid to serve as a cathode for the plasma is applied to the solid holding means by the first voltage applying means, ions in the plasma advance toward the impurity solid with great energy, so that the impurity included in the impurity solid is efficiently sputtered and mixed with high concentration into the plasma composed of the inert or reactive gas, as described above. Furthermore, when the voltage allowing the solid sample to serve as a cathode for the plasma is applied to the sample holding means by the second voltage applying means, the high-concentration impurity ions are introduced to the surface portion of the solid sample, as described above. Therefore, with the first impurity introduction apparatus, the impurity introduction method according to claim 1 of the invention can be surely realized in which a high-concentration impurity layer can be formed with high safety at the surface portion of the solid sample without generating a lattice defect at the solid sample.

A second impurity introduction apparatus according to the present invention comprises a vacuum chamber of which inside is kept vacuum, solid holding means provided in the vacuum chamber for holding an impurity solid which includes impurity, sample holding means provided in the vacuum chamber for holding a solid sample to which impurity is introduced, plasma generating means for generating plasma in the vacuum chamber, gas introducing means for introducing inert or reactive gas into the vacuum chamber, first voltage applying means for applying to the solid holding means a voltage allowing the impurity solid to serve as a cathode for the plasma, and second voltage applying means for applying to the sample holding means a voltage allowing the solid sample to serve as an anode for the plasma.

In the second impurity introduction apparatus, when the voltage allowing the impurity solid to serve as a cathode for the plasma is applied to the solid holding means by the first voltage applying means, the impurity included in the impurity solid is efficiently sputtered and mixed with high concentration into the plasma composed of the inert or reactive gas, as described above. Furthermore, when the voltage allowing the solid sample to serve as an anode for the plasma is applied to the sample holding means by the second voltage applying means, the high-concentration impurity ions are introduced to a region extremely close to the surface at the surface portion of the solid sample, as described above. Therefore, with the second impurity introduction apparatus, the second impurity introduction method can be surely realized in which a high-concentration impurity layer can be formed with high safety at the region extremely close to the surface at the surface portion of the solid sample without generating a lattice defect at the solid sample.

A third impurity introduction apparatus according to the present invention comprises a vacuum chamber of which inside is kept vacuum, solid holding means provided in the vacuum chamber for holding an impurity solid which includes impurity, sample holding means provided in the vacuum chamber for holding a solid sample to which impurity is introduced, plasma generating means for generating plasma in the vacuum chamber, gas introducing means for introducing inert or reactive gas into the vacuum chamber, first voltage applying means for applying to the solid holding means a voltage allowing the impurity solid to serve as an anode for the plasma, and second voltage applying means for applying to the sample holding means a voltage allowing the solid sample to serve as an anode for the plasma.

In the third impurity introduction apparatus, when the voltage allowing the impurity solid to serve as an anode for the plasma is applied to the solid holding means by the first voltage applying means, a relatively small amount of the impurity included in the impurity solid is sputtered and mixed with low concentration into the plasma composed of the inert or reactive gas, as described above. Furthermore, when the voltage allowing the solid sample to serve as an anode for the plasma is applied to the sample holding means by the second voltage applying means, the low-concentration impurity ions are introduced to a region extremely close to the surface at the surface portion of the solid sample, as described above. Therefore, with the third impurity introduction apparatus, the third impurity introduction method be surely realized in which a low-concentration impurity layer can be formed with high safety at the region extremely close to the surface at the surface portion of the solid sample without generating a lattice defect at the solid sample.

In the first or second impurity introduction apparatus, preferably, the first voltage applying means further includes means for applying to the solid holding means a voltage allowing the impurity solid to serve as an anode for the plasma, and means for switching a first state in which a voltage allowing the impurity solid to serve as a cathode for the plasma is applied and a second state in which a voltage allowing the impurity solid to serve as an anode for the plasma is applied.

As a result, either of the voltages allowing the impurity solid to serve as a cathode and an anode, respectively, can be applied to the solid holding means, whereby the impurity included in the impurity solid can be mixed into the plasma composed of the inert or reactive gas with either high or low concentration.

In the first impurity introduction apparatus, preferably, the second voltage applying means further includes means for applying to the sample holding means a voltage allowing the solid sample to serve as an anode for the plasma, and means for switching a first state in which a voltage allowing the solid sample to serve as a cathode for the plasma is applied and a second state in which a voltage allowing the solid sample to serve as an anode for the plasma is applied.

Thus, either of the voltages allowing the solid sample to serve as a cathode and an anode, respectively, can be applied to the sample holding means, whereby the depth of the impurity layer formed at the surface portion of the solid sample can be controlled.

A fourth impurity introduction apparatus according to the present invention comprises a vacuum chamber of which inside is kept vacuum, impurity deposition means to which impurity is deposited, sample holding means provided in the vacuum chamber for holding a solid sample to which impurity is introduced, shutter means for blocking a first region where the impurity deposition means is provided and a second region where the sample holding means is provided from each other and allowing these regions to communicate with each other, first gas introducing means for introducing gas which includes impurity to the first region in the vacuum chamber, plasma generating means for generating plasma in the vacuum chamber, second gas introducing means for introducing inert or reactive gas into the vacuum chamber, first voltage applying means for applying to the impurity deposition means a voltage allowing the impurity deposited on the impurity deposition means to serve as a cathode for the plasma, and second voltage applying means for applying to the sample holding means a voltage allowing the solid sample to serve as a cathode for the plasma.

In the fourth impurity introduction apparatus, in the vacuum chamber the first region where the impurity deposition means is provided is blocked by the shutter means from the second region where the solid sample is held, and thereafter the gas including impurity is introduced to the first region by the first gas introducing device, whereby the impurity is deposited to the impurity deposition means to form an impurity film composed of the impurity. After the first and second regions are allowed to communicate with each other, the plasma composed of the inert or reactive gas is generated inside the vacuum chamber by the plasma generating means and the voltage allowing the impurity film to serve as a cathode for the plasma is applied to the impurity deposition means by the first voltage applying means. As a result, the impurity included in the impurity film is efficiently sputtered and mixed with high concentration into the plasma composed of the inert or reactive gas, as described above. When the voltage allowing the solid sample to serve as a cathode for the plasma is applied to the sample holding means by the second voltage applying means, the high-concentration impurity ions are introduced to the surface portion of the solid sample, as described above. Therefore, according to the fourth impurity introduction apparatus, an impurity introduction method for forming a high-concentration impurity layer at the surface portion of the solid sample without causing a lattice defect at the solid sample can be realized without preparing the impurity solid.

A fifth impurity introduction apparatus according to the present invention comprises a vacuum chamber of which inside is kept vacuum, impurity deposition means to which impurity is deposited, sample holding means provided in the vacuum chamber for holding a solid sample to which impurity is introduced, shutter means for blocking a first region where the impurity deposition means is provided and a second region where the sample holding means is provided from each other and allowing these regions to communicate with each other, first gas introducing means for introducing gas which includes impurity to the first region in the vacuum chamber, plasma generating means for generating plasma in the vacuum chamber, second gas introducing means for introducing inert or reactive gas into the vacuum chamber, first voltage applying means for applying to the impurity deposition means a voltage allowing the impurity deposited on the impurity deposition means to serve as a cathode for the plasma, and second voltage applying means for applying to the sample holding means a voltage allowing the solid sample to serve as an anode for the plasma.

In the fifth impurity introduction apparatus, in the vacuum chamber the first region where the impurity deposition means is provided is blocked by the shutter means from the second region where the solid sample is held, and thereafter the gas including impurity is introduced to the first region by the first gas introducing device, whereby the impurity is deposited to the impurity deposition means to form an impurity film composed of the impurity. After the first and second regions are allowed to communicate with each other, the plasma composed of the inert or reactive gas is generated inside the vacuum chamber by the plasma generating means and the voltage allowing the impurity film to serve as a cathode for the plasma is applied to the impurity deposition means by the first voltage applying means. As a result, the impurity included in the impurity film is efficiently sputtered and mixed with high concentration into the plasma composed of the inert or reactive gas, as described above. When the voltage allowing the solid sample to serve as an anode for the plasma is applied to the sample holding means by the second voltage applying means, the high-concentration impurity ions are introduced to the region extremely close to the surface at the surface portion of the solid sample, as described above. Therefore, according to the fifth impurity introduction apparatus, an impurity introduction method for forming a high-concentration impurity layer at the region extremely close to the surface at the surface portion of the solid sample without causing a lattice defect can be realized without preparing the impurity solid.

A sixth impurity introduction apparatus according to the present invention comprises a vacuum chamber of which inside is kept vacuum, impurity deposition means to which impurity is deposited, sample holding means provided in the vacuum chamber for holding a solid sample to which impurity is introduced, shutter means for blocking a first region where the impurity deposition means is provided and a second region where the sample holding means is provided from each other and allowing these regions to communicate with each other, first gas introducing means for introducing gas which includes impurity to the first region in the vacuum chamber, plasma generating means for generating plasma in the vacuum chamber, second gas introducing means for introducing inert or reactive gas into the vacuum chamber, first voltage applying means for applying to the impurity deposition means a voltage allowing the impurity deposited on the impurity deposition means to serve as an anode for the plasma, and second voltage applying means for applying to the sample holding means a voltage allowing the solid sample to serve as an anode for the plasma.

In the sixth impurity introduction apparatus, in the vacuum chamber the first region where the impurity deposition means is provided is blocked by the shutter means from the second region where the solid sample is held, and thereafter the gas including impurity is introduced to the first region by the first gas introducing device, whereby the impurity is deposited to the impurity deposition means to form an impurity film composed of the impurity. After the first and second regions are allowed to communicate with each other, the plasma composed of the inert or reactive gas is generated inside the vacuum chamber by the plasma generating means and the voltage allowing the impurity film to serve as an anode for the plasma is applied to the impurity deposition means by the first voltage applying means. Thus, a relatively small amount of the impurity included in the impurity film is sputtered and mixed with low concentration into the plasma composed of the inert or reactive gas, as described above. When the voltage allowing the solid sample to serve as an anode for the plasma is applied to the sample holding means by the second voltage applying means, the low-concentration impurity ions are introduced to the region extremely close to the surface at the surface portion of the solid sample, as described above. Therefore, according to the sixth impurity introduction apparatus, an impurity introduction method for forming a low-concentration impurity layer at the region extremely close to the surface at the surface portion of the solid sample without causing a lattice defect can be realized without preparing the impurity solid.

In the fourth or fifth impurity introduction apparatus, preferably the first voltage applying means further includes means for applying to the impurity deposition means a voltage allowing the impurity deposited to the impurity deposition means to serve as an anode for the plasma, and means for switching a first state where the impurity deposited to the impurity deposition means serves as a cathode for the plasma and a second state where it serves as an anode.

Consequently, either of the voltages allowing the impurity film to serve as a cathode and an anode for the plasma, respectively, can be applied to the impurity deposition means, so that the impurity included in the impurity film can be mixed with either high or low concentration into the plasma composed of the inert or reactive gas.

In the fourth impurity introduction apparatus, preferably the second voltage applying means further includes means for applying to the sample holding means a voltage which allows the solid sample to serve as an anode for the plasma, and switching means for switching a first state where the solid sample serves as a cathode for the plasma and a second state where it serves as an anode for the plasma.

Thus, either of the voltages allowing the solid sample to serve as a cathode and an anode for the plasma, respectively, can be applied to the sample holding means, so that the depth of the impurity layer formed at the surface portion of the solid sample can be controlled.

In the first, second, fourth or fifth impurity introduction apparatus, the voltage allowing the function to serve as a cathode for the plasma is preferably a negative voltage; and in the second, third, fifth or sixth impurity introduction apparatus, the voltage allowing the function to serve as an anode for the plasma is preferably a voltage of 0 V or lower.

A first method of manufacturing a semiconductor device according to the present invention comprises the steps of: electrically isolating a diode formation region on a semiconductor substrate by an element isolation layer; holding in a vacuum chamber the semiconductor substrate at which the element isolation layer is formed and an impurity solid including the impurity to be introduced into the diode formation region; introducing inert or reactive gas into the vacuum chamber to generate plasma composed of the inert or reactive gas; applying to the impurity solid a voltage which allows the impurity solid to serve as a cathode for the plasma, performing sputtering of the impurity solid by ions in the plasma, and thereby mixing the impurity included in the impurity solid into the plasma composed of the inert or reactive gas; applying, to the semiconductor substrate held in the vacuum chamber, a voltage which allows the semiconductor substrate to serve as a cathode for the plasma and thereby introducing the impurity mixed into the plasma to a surface portion of the diode formation region at the semiconductor substrate to form an impurity layer; and, on the semiconductor substrate at which the impurity layer is formed, forming an interconnection layer electrically connected with the impurity layer.

According to the first method of manufacturing a semiconductor device, impurity can be introduced with high concentration to the surface portion of the diode formation region at the semiconductor substrate, similarly to the first impurity introduction method, so that a diode having a high-concentration impurity layer at the surface portion of the semiconductor substrate can be formed without generating a lattice defect at the semiconductor substrate and high safety is guaranteed.

A second method of manufacturing a semiconductor device according to the present invention comprises the steps of: electrically isolating a diode formation region on a semiconductor substrate by an element isolation layer; holding in a vacuum chamber the semiconductor substrate at which the element isolation layer is formed and an impurity solid including the impurity to be introduced into the diode formation region; introducing inert or reactive gas into the vacuum chamber to generate plasma composed of the inert or reactive gas; applying to the impurity solid a voltage which allows the impurity solid to serve as a cathode for the plasma, performing sputtering of the impurity solid by ions in the plasma, and thereby mixing the impurity included in the impurity solid into the plasma composed of the inert or reactive gas; applying, to the semiconductor substrate held in the vacuum chamber, a voltage which allows the semiconductor substrate to serve as an anode for the plasma and thereby introducing the impurity mixed into the plasma to a surface portion of the diode formation region at the semiconductor substrate to form an impurity layer; and, on the semiconductor substrate at which the impurity layer is formed, forming an interconnection layer electrically connected with the impurity layer.

According to the second method of manufacturing a semiconductor device, impurity can be introduced with high concentration to a region extremely close to the surface at the surface portion of the diode formation region at the semiconductor substrate, similarly to the second impurity introduction method, so that a diode having a high-concentration impurity layer at the region extremely close to the surface portion of the semiconductor substrate can be formed without generating a lattice defect at the semiconductor substrate and high safety is guaranteed.

A third method of manufacturing a semiconductor device according to the present invention comprises the steps of: electrically isolating a diode formation region on a semiconductor substrate by an element isolation layer; holding in a vacuum chamber the semiconductor substrate at which the element isolation layer is formed and an impurity solid including the impurity to be introduced into the diode formation region; introducing inert or reactive gas into the vacuum chamber to generate plasma composed of the inert or reactive gas; applying to the impurity solid a voltage which allows the impurity solid to serve as an anode for the plasma, performing sputtering of the impurity solid by ions in the plasma, and thereby mixing the impurity included in the impurity solid into the plasma composed of the inert or reactive gas; applying, to the semiconductor substrate held in the vacuum chamber, a voltage which allows the semiconductor substrate to serve as an anode for the plasma and thereby introducing the impurity mixed into the plasma to a surface portion of the diode formation region at the semiconductor substrate to form an impurity layer; and, on the semiconductor substrate at which the impurity layer is formed, forming an interconnection layer electrically connected with the impurity layer.

According to the third method of manufacturing a semiconductor device, impurity can be introduced with low concentration to a region extremely close to the surface at the surface portion of the diode formation region at the semiconductor substrate, similarly to the third impurity introduction method, so that a diode having a low-concentration impurity layer at the region extremely close to the surface portion of the semiconductor substrate can be formed without generating a lattice defect at the semiconductor substrate and high safety is guaranteed.

A fourth method of manufacturing a semiconductor device according to the present invention comprises the steps of: electrically isolating a transistor formation region on a semiconductor substrate by an element isolation layer; forming an electrode at the transistor formation region on the semiconductor substrate where the element isolation layer is formed with an insulating layer interposed therebetween; holding in a vacuum chamber the semiconductor substrate at which the electrode is formed and an impurity solid which includes impurity to be introduced into the transistor formation region; introducing inert or reactive gas into the vacuum chamber to generate plasma composed of the inert or reactive gas; applying to the impurity solid a voltage which allows the impurity solid to serve as a cathode for the plasma, performing sputtering of the impurity solid by ions in the plasma, and thereby mixing the impurity included in the impurity solid to the plasma composed of the inert or reactive gas; applying, to the semiconductor substrate held in the vacuum chamber, a voltage which allows the semiconductor substrate to serve as a cathode for the plasma, and thereby introducing the impurity mixed into the plasma to the surface portion of the transistor formation region at the semiconductor substrate to form an impurity layer; and forming an interconnection layer electrically connected with the electrode of the semiconductor substrate where the impurity layer is formed.

According to the fourth method of manufacturing a semiconductor device, similarly to the first impurity introduction method, the impurity can be introduced with high concentration to the surface portion of the transistor formation region at the semiconductor substrate, whereby a transistor having a high-concentration impurity layer at the surface portion of the semiconductor substrate can be formed without generating a lattice defect at the semiconductor substrate and high safety is guaranteed.

A fifth method of manufacturing a semiconductor device according to the present invention comprises the steps of: electrically isolating a transistor formation region on a semiconductor substrate by an element isolation layer; forming an electrode at the transistor formation region on the semiconductor substrate where the element isolation layer is formed with an insulating layer interposed therebetween; holding in a vacuum chamber the semiconductor substrate at which the electrode is formed and an impurity solid which includes impurity to be introduced into the transistor formation region; introducing inert or reactive gas into the vacuum chamber to generate plasma composed of the inert or reactive gas; applying to the impurity solid a voltage which allows the impurity solid to serve as a cathode for the plasma, performing sputtering of the impurity solid by ions in the plasma, and thereby mixing the impurity included in the impurity solid to the plasma composed of the inert or reactive gas; applying, to the semiconductor substrate held in the vacuum chamber, a voltage which allows the semiconductor substrate to serve as an anode for the plasma, and thereby introducing the impurity mixed into the plasma to the surface portion of the transistor formation region at the semiconductor substrate to form an impurity layer; and forming an interconnection layer electrically connected with the electrode of the semiconductor substrate where the impurity layer is formed.

According to the fifth method of manufacturing a semiconductor device, similarly to the second impurity introduction method, the impurity can be introduced with high concentration to a region extremely close to the surface at the surface portion of the transistor formation region at the semiconductor substrate, whereby a transistor having a high-concentration impurity layer in the region extremely close to the surface at the surface portion of the semiconductor substrate can be formed without generating a lattice defect at the semiconductor substrate and high safety is guaranteed.

A sixth method of manufacturing a semiconductor device according to the present invention comprises the steps of: electrically isolating a transistor formation region on a semiconductor substrate by an element isolation layer; forming an electrode at the transistor formation region on the semiconductor substrate where the element isolation layer is formed with an insulating layer interposed therebetween; holding in a vacuum chamber the semiconductor substrate at which the electrode is formed and an impurity solid which includes impurity to be introduced into the transistor formation region; introducing inert or reactive gas into the vacuum chamber to generate plasma composed of the inert or reactive gas; applying to the impurity solid a voltage which allows the impurity solid to serve as an anode for the plasma, performing sputtering of the impurity solid by ions in the plasma, and thereby mixing the impurity included in the impurity solid to the plasma composed of the inert or reactive gas; applying, to the semiconductor substrate held in the vacuum chamber, a voltage which allows the semiconductor substrate to serve as an anode for the plasma, and thereby introducing the impurity mixed into the plasma to the surface portion of the transistor formation region at the semiconductor substrate to form an impurity layer; and forming an interconnection layer electrically connected with the electrode of the semiconductor substrate where the impurity layer is formed.

According to the sixth method of manufacturing a semiconductor device, similarly to the third impurity introduction method, the impurity can be introduced with low concentration to a region extremely close to the surface at the surface portion of the transistor formation region at the semiconductor substrate, whereby a transistor having a low-concentration impurity layer in the region extremely close to the surface at the surface portion of the semiconductor substrate can be formed without generating a lattice defect at the semiconductor substrate and high safety is guaranteed.

In the first, second, fourth or fifth method of manufacturing a semiconductor device, the voltage allowing the function to serve as a cathode for the plasma is preferably a negative voltage; and in the second, third, fourth or fifth method of manufacturing a semiconductor device, the voltage allowing the function to serve as an anode for the plasma is preferably a voltage of 0 V or lower.

In the first to sixth methods of manufacturing a semiconductor device, preferably, the semiconductor substrate is composed of silicon, the impurity is arsenic, phosphorus, boron, aluminum, antimony, gallium, or indium, and the inert or reactive gas is the gas including nitrogen or argon.

BRIEF DESCRIPTION OF THE DRAWINGS

FIG. 3 is a schematic diagram showing an impurity introduction apparatus according to a second embodiment of the present invention.

DETAILED DESCRIPTION OF THE INVENTION

[First Embodiment]

Now, an impurity introduction apparatus according to a first embodiment of the present invention will be described with reference to FIG. 1.

Figure 1:
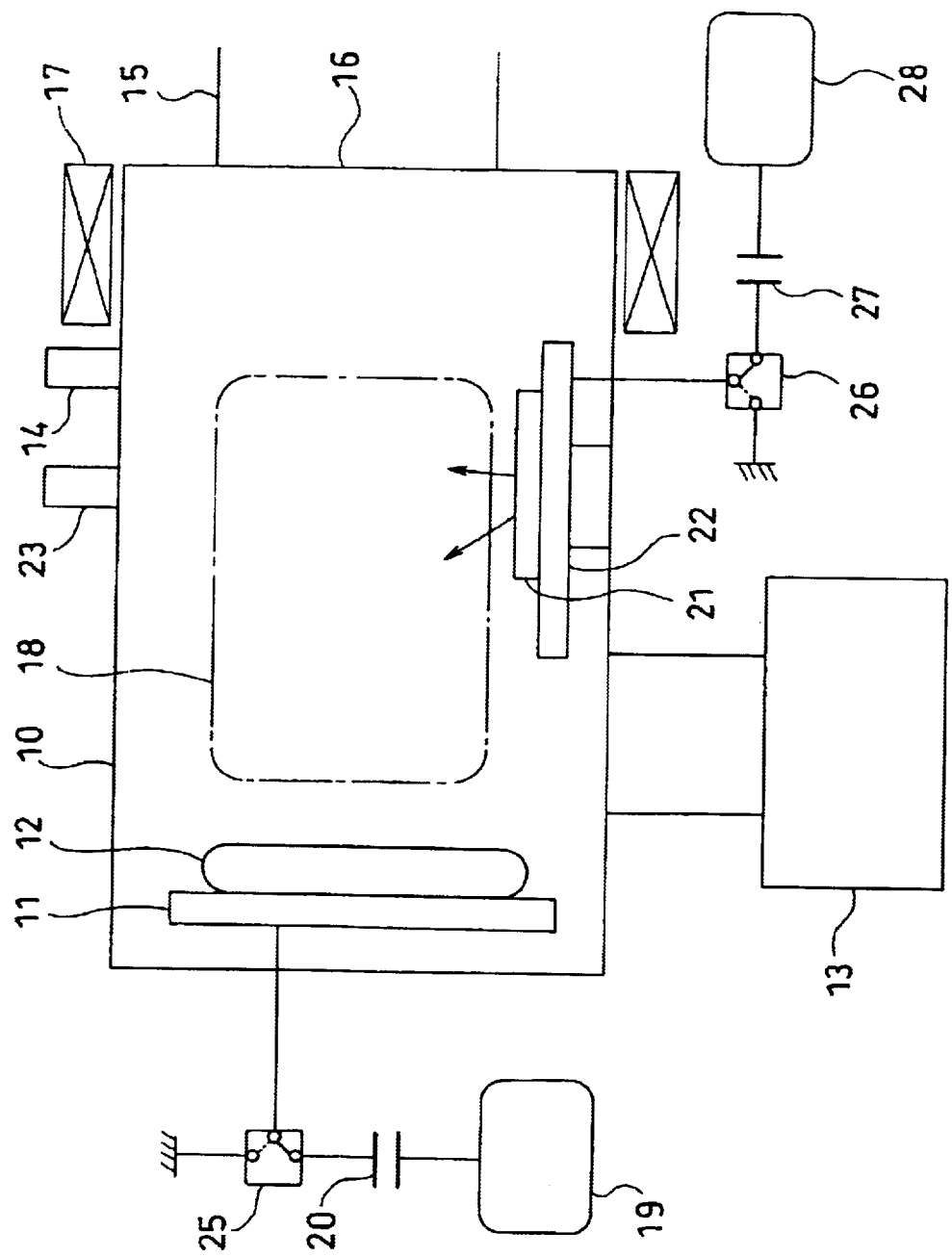
FIG. 1 is a schematic diagram showing an impurity introduction apparatus according to a first embodiment of the present invention.

FIG. 1 shows a vacuum chamber 10, and a sample holder 11 provided inside the vacuum chamber 10 for holding a solid sample 12 composed of, for example, a silicon substrate and into which impurity is introduced, wherein the sample holder 11 includes temperature control means for maintaining the solid sample 12 at a prescribed temperature. FIG. 1 also shows a pressure reducing pump for reducing the pressure inside the vacuum chamber 10, a source gas feed 14 for supplying doping gas to the vacuum chamber 10, a microwave guide 15 connected to the vacuum chamber 10, a quartz plate 16 provided between the vacuum chamber 10 and the microwave guide 15, and an electromagnet 17 arranged outside the vacuum chamber 10. The microwave guide 15, the quartz plate 16 and the electromagnet 17 compose ECR plasma generating means as plasma generating means. Combination of a turbo molecular pump and a so-called drying pump is used as the pressure reducing pump 13. FIG. 1 further shows a plasma region 18, a first high-frequency power supply 19 connected to the sample holder 11 through a first capacitor 20, an impurity solid 21 including an impurity element such as boron, a solid holder 22 for holding the impurity solid 21, and a rare gas feed 23 for introducing rare gas into the vacuum chamber 10.

The first embodiment is characterized in that a first selector switch 25 is connected to the sample holder 11, which is capable of connecting the sample holder 11 to the first high-frequency power supply 19 through the first capacitor 20 so that the sample holder 11 serves as a cathode for the plasma and capable of connecting the sample holder 11 to ground so that the holder 11 serves as an anode.

The first embodiment is also characterized in that a second selector switch 26 is connected to the solid holder 22, which is capable of connecting the solid holder 22 to a second high-frequency power supply 28 through a second capacitor 27 so that the solid holder 22 serves as a cathode for the plasma and capable of connecting the solid holder 22 to ground so that the holder 22 serves as an anode for the plasma.

[First Impurity Introduction Method]

Now, a first impurity introduction method will be described with reference to FIG. 1. The first impurity introduction method is realized with use of the impurity introduction apparatus according to the first embodiment, and is related to a case where both the sample holder 11 and the solid holder 22 are to serve as cathodes for the plasma.

First, the pressure reducing pump 13 is activated to achieve the vacuum of approximately $5 \times 10^{-7}$ Torr inside the vacuum chamber 10, and the temperature of the sample holder 11 is maintained at approximately 10° C. by the temperature control means included in the sample holder 11. A silicon wafer is used as the solid sample 12 and a board-shaped material or an aggregate of particles composed of boron is used as the impurity solid 21.

In this state, Ar gas is introduced from the rare gas feed 23 by 10 cc per minute, and the vacuum of approximately $4 \times 10^{-4}$ Torr is retained inside the vacuum chamber 10 by the pressure reducing pump 13. In addition, microwave of 2.45 GHz is guided from the microwave guide 15 and a magnetic field is induced by the electromagnet 17 so as to generate the plasma current with density of approximately 2.5 mA/cm² and generate Ar plasma in the plasma region 18.

Next, the first selector switch 25 is operated to apply high-frequency electric power of 13.56 MHz from the first high-frequency power supply 19 through the first capacitor 20 to the sample holder 11 so as to make the sample holder 11 a cathode. Thus, a great potential difference of, for example, 700 V is generated between the solid sample 12 held by the sample holder 11 and the Ar plasma in the plasma region 18. In addition, the second selector switch 26 is operated to apply high-frequency electric power of 13.56 MHz from the second high-frequency power supply 28 to the solid holder 22 through the second capacitor 27 to make the solid holder 22 a cathode. As a result, the solid holder 22 serves as a cathode for the plasma thus generated, and the potential of the solid holder 22 becomes lower than that of the Ar plasma by 500 V in this case, although the value depends on the conditions of the Ar plasma. Because of this potential difference the Ar ions in the Ar plasma intensely collide with the impurity solid 21, and boron included in the impurity solid 21 is mixed into the Ar plasma with high concentration by sputtering phenomenon. At this step, it is preferable to set the vacuum of the vacuum chamber 10 to a low value at the level of $1 \times 10^{-4}$ Torr and set the average free path distance of the Ar ions to the level of several tens of centimeters. As a result, the sputtered boron uniformly is diffused into the Ar plasma relatively easily.

Boron thus diffused into the Ar plasma uniformly and with high concentration is introduced to the vicinity of the surface portion of the solid sample 12 because of the potential difference (of approximately 700 V in this case) between the solid sample 12 and the Ar plasma.

While the time required for introduction of boron into the vicinity of the surface portion of the solid sample 12 is approximately 100 seconds if the solid sample 12 is not made to function as a cathode for the plasma, it is only 2 seconds if this first impurity introduction method is employed since the solid sample 12 functions as a cathode for the plasma.

Figure 2:
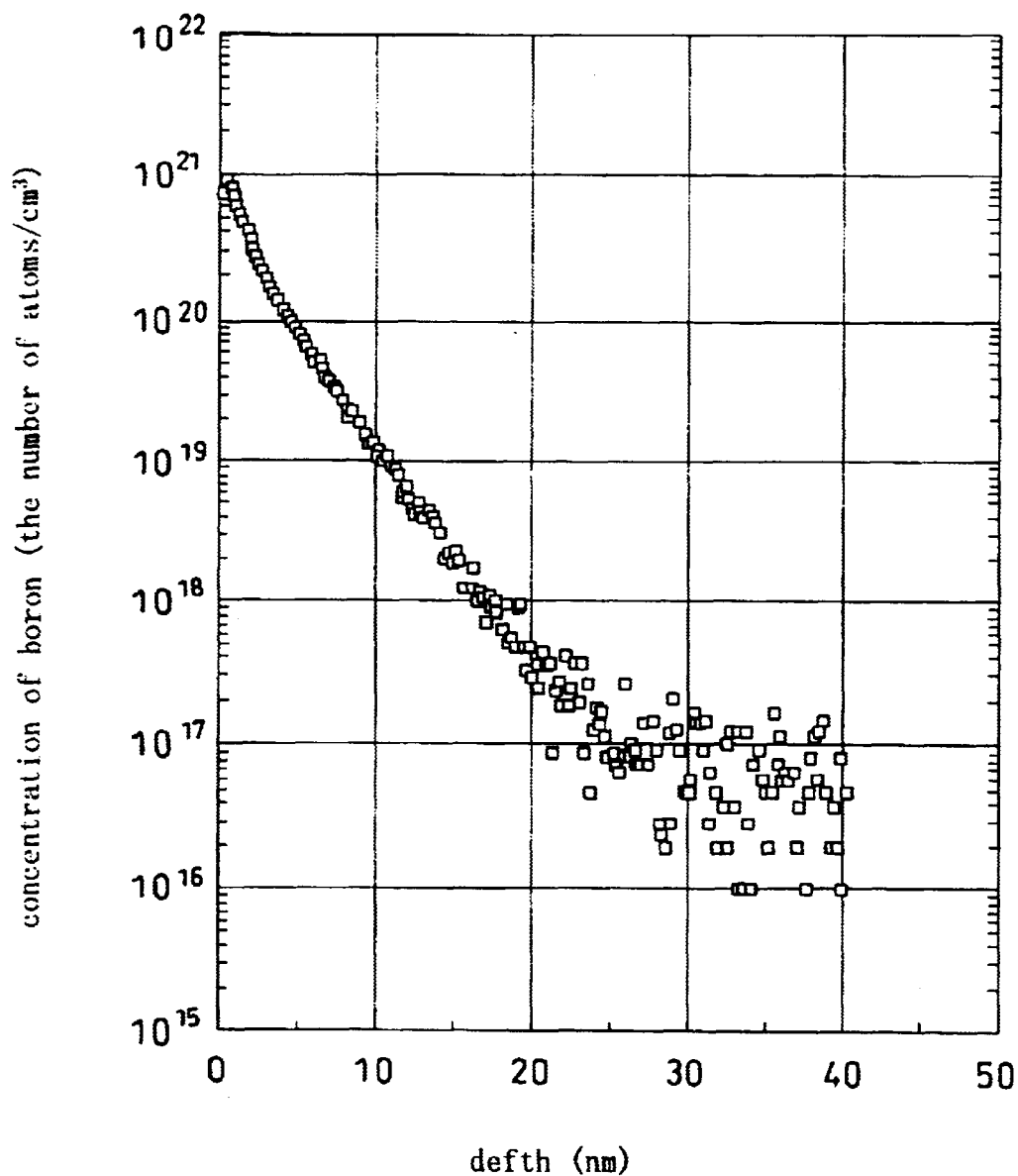
FIG. 2 shows the result, obtained by SIMS, of the relation between the boron concentration and the depth at the solid sample formed using the first impurity introduction method according to the present invention.

FIG. 2 shows the result obtained by SIMS, related to the relation between the boron concentration and the depth in the solid sample 12: it can be confirmed that boron is introduced to the vicinity of the surface portion of the solid sample 12.

[Second Impurity Introduction Method]

Now, a second impurity introduction method will be described with reference to FIG. 1. The second impurity introduction method is achieved with use of the impurity introduction apparatus according to the first embodiment, and is related to a case where the sample holder 11 serves as an anode and the solid holder 22 as a cathode for the plasma.

First, similarly to the first impurity introduction method, the pressure reducing pump 13 is activated to achieve the vacuum of approximately $5 \times 10^{-7}$ Torr inside the vacuum chamber 10, and the temperature of the sample holder 11 is maintained at approximately 10° C. by the temperature control means included in the sample holder 11. A silicon wafer is used as the solid sample 12 and a board-shaped material or an aggregate of particles composed of boron is used as the impurity solid 21. In this state, Ar gas is introduced from the rare gas feed 23 by 10 cc per minute, and the vacuum of approximately $4 \times 10^{-4}$ Torr is retained inside the vacuum chamber 10 by the pressure reducing pump 13. In addition, microwave of 2.45 GHz is guided from the microwave guide 15 and a magnetic field is induced by the electromagnet 17 so as to obtain the plasma current with density of approximately 2.5 mA/cm$^2$ and generate Ar plasma in the plasma region 18.

Next, the first selector switch 25 is operated to connect the sample holder 11 to ground so as to make the sample holder 11 an anode. Thus, a small potential difference of, for example, 50 V is generated between the solid sample 12 held by the sample holder 11 and the Ar plasma in the plasma region 18. The second selector switch 26 is also operated to apply high-frequency electric power of 13.56 MHz from the second high-frequency power supply 28 to the solid holder 22 through the second capacitor 27 so that the solid holder 22 serves as a cathode. Consequently, the solid holder 22 serves as a cathode for the generated plasma, and the potential of the solid holder 22 becomes lower than that of the Ar plasma by approximately 500 V in this case, although the value depends on the conditions of the Ar plasma. The Ar ions in the Ar plasma intensely collide with the impurity solid 21 because of this potential difference, and boron included in the impurity solid 21 is mixed into the Ar plasma with high concentration by sputtering phenomenon. At this step, it is preferable to set the vacuum of the vacuum chamber 10 to a low value at the level of $1 \times 10^{-4}$ Torr and set the average free path distance of the Ar ions to the level of several tens of centimeters. As a result, the sputtered boron uniformly is diffused into the Ar plasma relatively easily.

Boron thus diffused into the Ar plasma uniformly and with high concentration is introduced to the surface portion of the solid sample 12 because of the small potential difference (of approximately 50 V in this case) between the solid sample 12 and the Ar plasma; here, since highly concentrated boron advances toward the solid sample 12 with small energy, a high-concentration impurity layer is formed at a region into extremely close to the surface of the solid sample 12.

[Third Impurity Introduction Method]

A third impurity introduction method will be described below with reference to FIG. 1. The third impurity introduction method is achieved with use of the impurity introduction apparatus according to the first embodiment, and is related to a case where both the sample holder 11 and the solid holder 22 serve as anodes for the plasma.

First, similarly to the first impurity introduction method, the pressure reducing pump 13 is activated to achieve the vacuum of approximately $5 \times 10^{-7}$ Torr inside the vacuum chamber 10, and the temperature of the sample holder 11 is maintained at approximately 10° C. by the temperature control means included in the sample holder 11. A silicon wafer is used as the solid sample 12 and a board-shaped material or an aggregate of particles composed of boron is used as the impurity solid 21. In this state, Ar gas is introduced from the rare gas feed 23 by 10 cc per minute, and the vacuum of approximately $4 \times 10^{-4}$ Torr is retained inside the vacuum chamber 10 by the pressure reducing pump 13. In addition, microwave of 2.45 GHz is guided from the microwave guide 15 and a magnetic field is induced by the electromagnet 17 so as to generate the plasma current with density of approximately 2.5 mA/cm$^2$ and generate Ar plasma in the plasma region 18.

Next, the first selector switch 25 is operated to connect the sample holder 11 to ground so as to make the sample holder 11 an anode. Thus, a small potential difference of, for example, 50 V is generated between the solid sample 12 held by the sample holder 11 and the Ar plasma in the plasma region 18. The second selector switch 26 is also operated to connect the solid holder 22 to ground so as to make the solid holder 22 an anode. Consequently, the solid holder 22 serves as an anode for the generated plasma, the Ar ions in the Ar plasma collide with the impurity solid 21 with small energy because the potential difference between the solid holder 22 and the Ar plasma is small, and boron included in the impurity solid 21 is mixed into the Ar plasma with low concentration by sputtering phenomenon. At this step, it is preferable to set the vacuum of the vacuum chamber 10 to a low value at the level of $1 \times 10^{-4}$ Torr and set the average free path distance of the Ar ions to the level of several tens of centimeters. As a result, the sputtered boron uniformly is diffused into the Ar plasma relatively easily.

Boron thus diffused into the Ar plasma uniformly and with low concentration is introduced to the surface portion of the solid sample 12 because of the small potential difference (of approximately 50 V in this case) between the solid sample 12 and the Ar plasma. Since boron with low concentration advances toward the solid sample 12 with small energy, a low-concentration impurity layer is formed at a region extremely close to the surface of the solid sample 12.

For the first to third impurity introduction methods realized with use of the impurity introduction apparatus according to the first embodiment, the source gas feed 14 for supplying doping gas to the vacuum chamber 10 is not used.

While as the plasma generation means the ECR plasma generation means for guiding microwave of 2.45 GHz is employed above, the plasma generation means is not limited thereto and other plasma generation means such as ICP and helicon can also be used. Furthermore, while high-frequency electric power of 13.56 MHz is applied to the sample holder 11 and solid holder 22, the frequency of the high-frequency electric power is not limited thereto. The frequency of the high-frequency electric power applied to the sample holder 11 can be either the same as or different from that applied to the solid holder 22, and the first and second high-frequency power supplies 19 and 28 can be shared when the same frequency is employed. It is only natural that the flow rates of the rare gas and the source gas introduced into the vacuum chamber 10 and the vacuum of the vacuum chamber 10 should be set to the optimum values depending on the shape and size of the vacuum chamber 10.

[Second Embodiment]

Now, an impurity introduction apparatus according to a second embodiment of the present invention will be described with reference to FIG. 3.

Since the impurity introduction apparatus according to the second embodiment is basically similar to the impurity introduction apparatus according to the first embodiment, identical elements are labeled with the identical numerals and description thereof will not be repeated.

The impurity introduction apparatus according to the second embodiment is characterized in that the solid holder 22 for holding the impurity solid is not provided but instead an impurity deposition table 30 is provided which is composed of metal or insulator and to which impurity is deposited, and on the impurity deposition table 30 an impurity film 31 composed of, for example, boron is deposited in accordance with the method described below. The second selector switch 26, which is connected to the impurity deposition table 30, can connect the impurity deposition table 30 to the second high-frequency power supply 28 through the second capacitor 27 to allow the impurity deposition table 30 to serve as a cathode and can connect the impurity deposition table 30 to ground to allow it to serve as an anode. In addition, between the solid sample 12 held by the sample holder 11 and the plasma region 18 a shutter 32 is provided for allowing them to communicate with each other and blocking one from the other. It should be noted that the shutter 32 is indicated by the broken line in FIG. 3 for the sake of illustration.

[Fourth Impurity Introduction Method]

A fourth impurity introduction method will be described below with reference to FIG. 3. The fourth impurity introduction method is achieved by using the impurity introduction apparatus according to the second embodiment, and is related to a case where the sample holder 11 and the impurity deposition table 30 are both made to serve as cathodes for the plasma.

First, the shutter 32 is closed to block the sample holder 11 and the plasma region 18 from each other, and in such state the pressure reducing pump 13 is activated to keep the vacuum of approximately $5 \times 10^{-3}$ Torr inside the vacuum chamber 10. The second selector switch 26 is operated to apply high-frequency electric power of 13.56 MHz from the second high-frequency power supply 28 to the impurity deposition table 30 through the second capacitor 27 so as to make the impurity deposition table 30 a cathode.

Next, gas including impurity, such as $B_2H_6$, is supplied from the source gas feed 14 to the vacuum chamber 10 by 50 cc per minute, microwave of 2.45 GHz is guided from the microwave guide 15, and a magnetic field is induced by the electromagnet 17, thereby generating the plasma current density of approximately 2.5 mA/cm². As a result, $B_2H_6$ is made into plasma and boron ions advance toward the impurity deposition table 30, and the impurity film 31 composed of boron is deposited at the impurity deposition table 30.

While the impurity film 31 is formed with higher efficiency at a lower temperature by the generation of the plasma composed of $B_2H_6$ in the case described above, the impurity film 31 of boron can be deposited at the impurity deposition table 30 only by supplying $B_2H_6$ from the source gas feed 14 to the vacuum chamber 10 without generating the plasma composed of $B_2H_6$, similarly to the conventional CVD method.

Next, after gas including hydrogen in the vacuum chamber 10 is discharged, the shutter 32 is opened to allow the sample holder 11 and the plasma region 18 to communicate with each other. Thereafter, the pressure reducing pump 13 is activated to keep the vacuum of approximately $4 \times 10^{-4}$ Torr inside the vacuum chamber 10, and the temperature of the sample holder 11 is maintained at approximately 10° C. by the temperature control means included in the sample holder 11.

In this state, similarly to the first impurity introduction method using the impurity introduction apparatus according to the first embodiment, Ar gas is introduced from the rare gas feed 23 by 10 cc per minute, microwave of 2.45 GHz is guided from the microwave guide 15, and a magnetic field is induced by the electromagnet 17, thereby obtaining the plasma current with density of approximately 2.5 mA/cm², so that Ar plasma is generated in the plasma region 18. Next, the first selector switch 25 is operated to apply the high-frequency electric power of 13.56 MHz from the first high-frequency power supply 19 to the sample holder 11 through the first capacitor 20, thereby allowing the sample holder 11 to serve as a cathode; and the second selector switch 26 is operated to apply high-frequency electric power of 13.56 MHz from the second high-frequency power supply 28 to the impurity deposition table 30 through the second capacitor 27 to allow the impurity deposition table 30 to serve as a cathode. As a result, the impurity deposition table 30 serves as a cathode for the plasma, and the potential of the impurity deposition table 30 becomes lower than that of the Ar plasma by approximately 500 V. By this potential difference the Ar ions in the Ar plasma intensely collide with the impurity film 31, and boron included in the impurity film 31 is mixed into the Ar plasma with high concentration by sputtering phenomenon. Boron thus diffused uniformly and with high concentration into the Ar plasma is introduced to the vicinity of the surface portion of the solid sample 12 because of the potential difference of approximately 700 V between the solid sample 12 and the Ar plasma.

In accordance with the impurity introduction method described above, boron is introduced to the vicinity of the surface portion of the solid sample 12, similarly to the result shown in FIG. 2.

Since less hydrogen is introduced to the solid sample 12 in this method than in the method where the impurity is directly doped with the use of $B_2H_6$, the problem of generating a lattice defect at the solid sample can be avoided.

[Method of Manufacturing a Semiconductor Device Having a Diode]

Description will now be made of a method of manufacturing a semiconductor device having a diode realized by using respective impurity introduction methods described above, with reference to FIGS. 4(a)–(b) and 5(a)–(b).

Figure 4A:
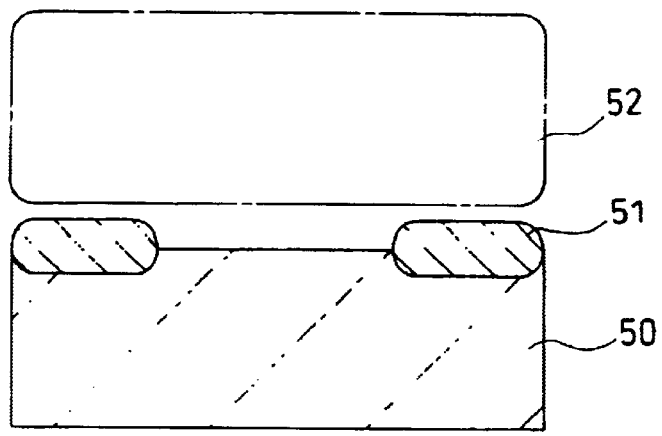
FIGS. 4(a) and (b) are cross sectional views showing respective steps in a method of manufacturing a semiconductor device having a diode, achieved by using the impurity introduction method according to the present invention.

First, as shown in FIG. 4(a), an element isolation layer 51 is formed at a prescribed region on a semiconductor substrate 50, and then the semiconductor substrate 50 is held by the solid holder 11 in the impurity introduction apparatus according to the first or second embodiment.

Figure 4B:
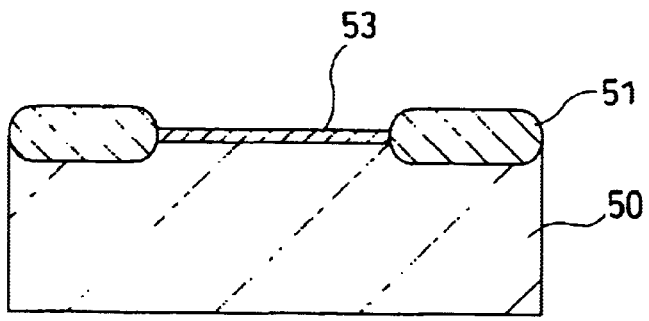

Next, in accordance with the first or fourth impurity introduction method described above, plasma 52 composed of impurity is generated in the vicinity of the semiconductor substrate 50, and an impurity layer 53 is formed in the vicinity of the surface portion of the semiconductor substrate 50 as shown in FIG. 4(b).

Figure 5A:
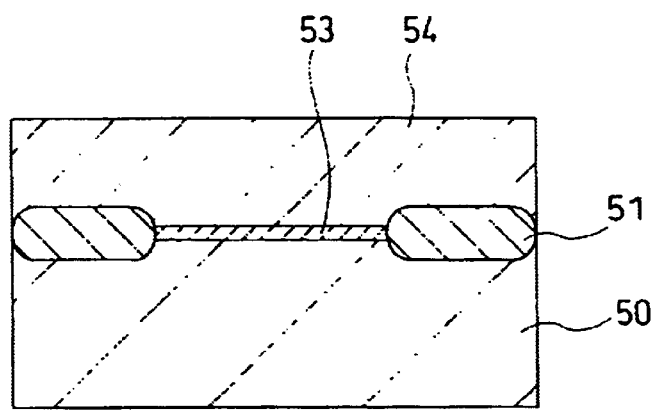
FIGS. 5(a) and (b) are cross sectional views showing respective steps in the method of manufacturing a semiconductor device having a diode, achieved by using the impurity introduction method according to the present invention.

Then, referring to FIG. 5(a), an insulating film 54 formed of a silicon oxide film or the like by, for example, CVD method is deposited on the entire surface of the semiconductor substrate 50 to have a thickness of, for example, 500 nm. Thereafter, appropriate thermal treatment, for example thermal treatment at the temperature of 1000° C. for 10 seconds, may be performed to control the impurity profile of the impurity layer 53.

Figure 5B:
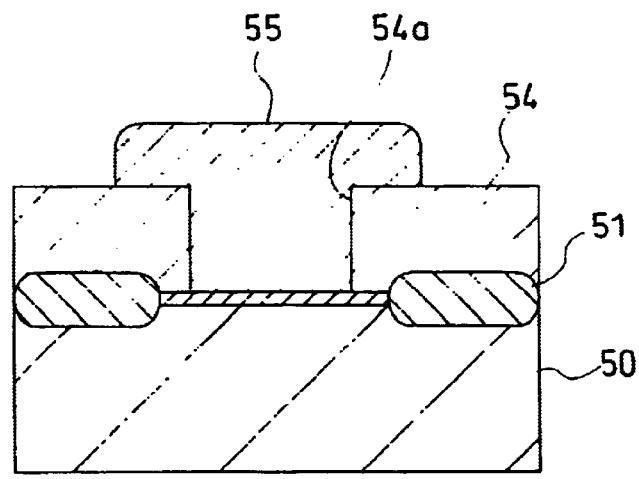

Referring now to FIG. 5(b), an opening portion 54a is formed at the insulating film 54 by photo-lithography and etching, a single-layered or multi-layered metal film is deposited on the entire surface, and the metal film is patterned by photolithography and etching to form a metal interconnection layer 55 composed of the metal film above.

It should be noted that, since the first or fourth impurity introduction method is used for the above-described method of manufacturing a semiconductor device having a diode, the impurity layer 53 can be formed with a relatively great depth and high concentration in the vicinity of the surface portion of the semiconductor substrate 50: if the second impurity introduction method is employed, a shallow impurity layer 53 with high concentration can be formed in the vicinity of the surface portion of the semiconductor substrate 50; and if the third impurity introduction method is employed, a shallow impurity layer 53 with low concentration can be formed in the vicinity of the surface portion of the semiconductor substrate 50. It goes without saying that a so-called bipolar element can be formed by, for example, stacking thus formed impurity layers.

[Method of Manufacturing a Semiconductor Device Having a CMOS]

Now, a method of manufacturing a semiconductor device having a CMOS realized by using the first or fourth impurity introduction method described above will be described below with reference to FIGS. 6(a)–(b) and 7(a)–(b). Description below is directed to a case where the first impurity introduction method is employed, for convenience.

Figure 6A:
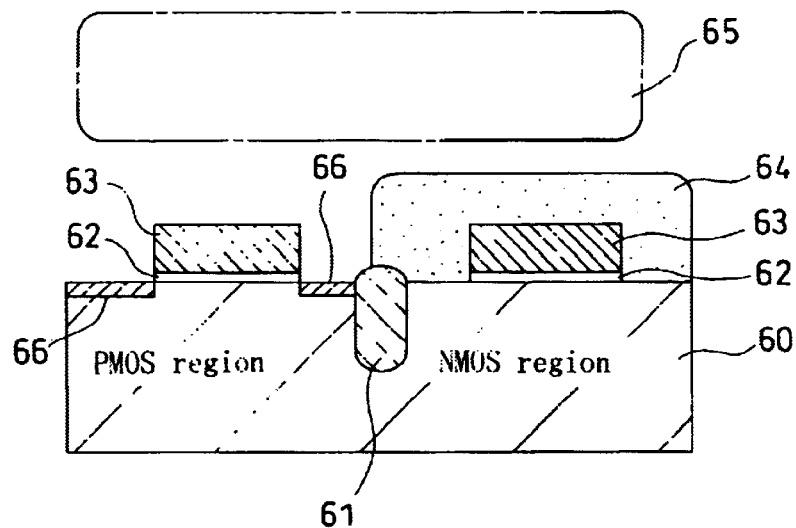
FIGS. 6(a) and (b) are cross sectional views showing respective steps in a method of manufacturing a semiconductor device having a CMOS, achieved by using the impurity introduction method according to the present invention.

First, as shown in FIG. 6(a), an element isolation region 61 is formed between a PMOS region and an NMOS region on a semiconductor substrate 60, a gate insulating film 62 and a gate electrode 63 are formed in each of the PMOS and NMOS regions, and a first resist pattern 64 having an opening portion in the PMOS region and composed of novolak resin, polyvinyl phenol, or the like is formed.

In this state, the semiconductor substrate 60 is held by the solid holder 11 in the impurity introduction apparatus according to the first or second embodiment, and then P type impurity such as boron is introduced with use of the first impurity introduction method. More specifically, the impurity solid 21 having boron as the main component is disposed on the solid holder 22, inert gas such as Ar gas is introduced from the rare gas feed 14 to generate Ar plasma 65, and boron is introduced to the surface portion of the semiconductor substrate 60. This is conducted under the conditions where microwave with the frequency of 2.45 GHz is guided with the power of approximately 500 W and the high-frequency power of approximately 300 W with the frequency of 13.56 MHz is applied to the sample holder 11 and solid holder 22. In addition, the vacuum in the vacuum chamber 10 when the Ar gas is introduced is kept at approximately $3 \times 10^{-4}$ Torr. By irradiation of the plasma a native oxide film at the surface of the semiconductor substrate 60 is removed to thus expose a clean and active surface portion, and an impurity layer 66 of boron is formed at the surface portion.

As a result, components of inert gas such as Ar gas, and reactive gas such as boron are introduced, as an impurity, to the impurity layer. In this case, despite of the fact that the concentration of impurity in the impurity layer is dependable on the concentration of the introduced inert and reactive gas, the concentration exceeds $1 \times 10^{20}$ cm$^{-3}$.

Generally, by only exposing the semiconductor substrate 60 to the atmosphere, a thin layer of oxide film will form on the surface of the semiconductor substrate 60. However, this thin layer of oxide film will be removed during the process of sputtering, caused by the irradiation of the Ar plasma on the surface of the semiconductor substrate 60. Therefore, resulting the exposure of a clean surface on the semiconductor substrate 60 where impurity ions—such as the boron ion is concurrently being infused. In this case, due to the effect of the infusion of impurity ions and the exposure of Ar plasma 65 on the surface of the semiconductor substrate 60, the rearrangement of impurity within the structure of the semiconductor substrate 60 occurs. As a result, electrically active impurity will be generated on the surface of the semiconductor substrate 60 due to the introduction and annealing effect of impurity.

Figure 10:
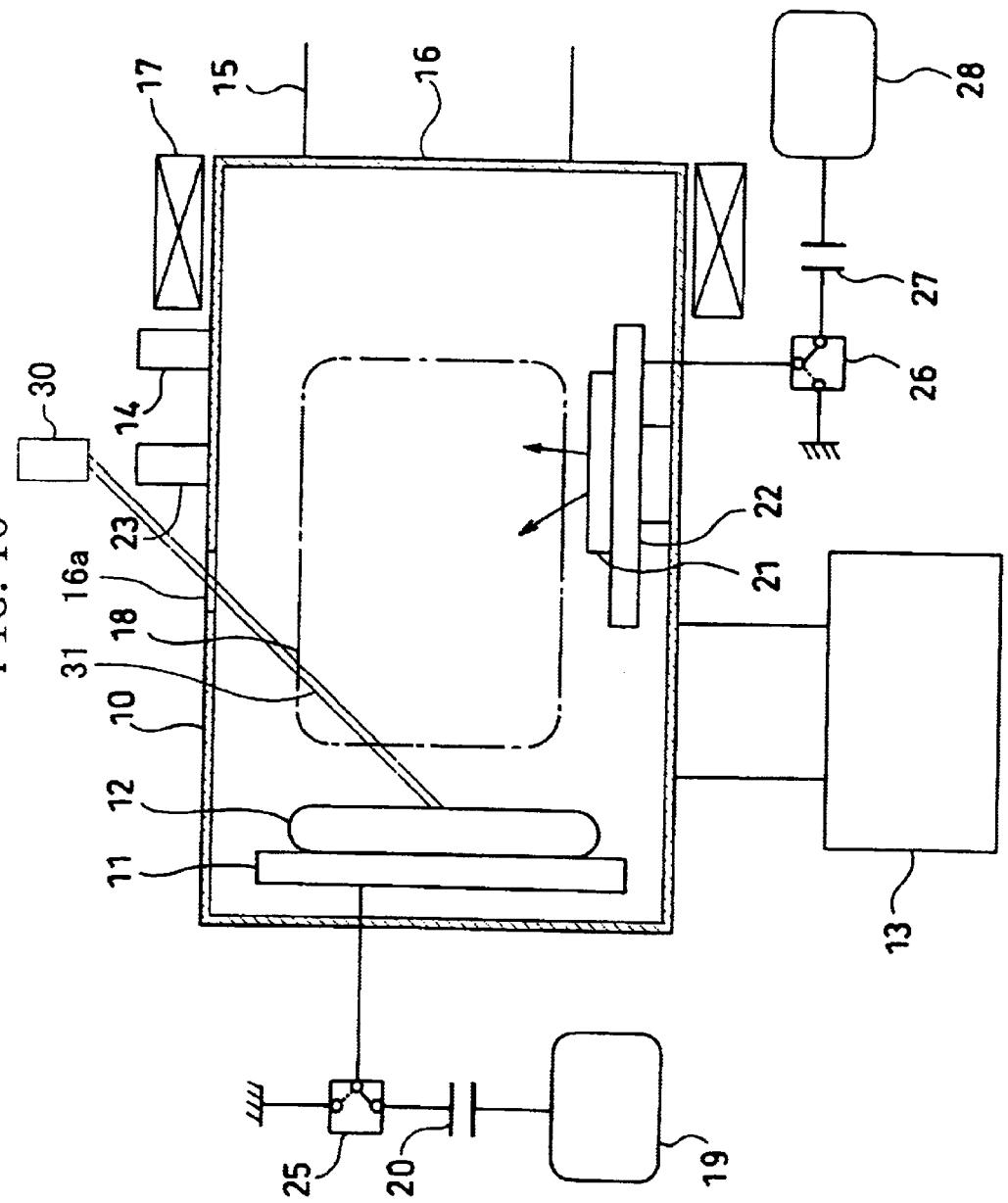
FIG. 10 is a schematic diagram showing an impurity introduction apparatus according to a modification of the first embodiment of the present invention.

Therefore, the concentration of the components of inert gas such as Ar gas, and reactive gas such as boron, introduced to impurity layer 66 exceeds $1 \times 10^{20}$ cm$^{-3}$. Alternatively, refer to FIG. 10, which shows a diagram of an impurity introduction apparatus use for the method of introducing P type impurity such as boron.

Inert gas such as Ar gas is introduced into the vacuum chamber 16 through source gas feed 14, and Ar plasma 65 is generated. Once boron is introduced to the surface portion of the semiconductor substrate 60, laser beam 31, generated by laser 30 which is set outside of vacuum chamber 16, is delivered through the inlet 16a onto the surface of the semiconductor substrate 60.

As a result, due to the infusion of impurity ions and the exposure of Ar plasma 65, an annealing effect occur on the surface of the semiconductor substrate 60 as impurity, as well as laser beam 31 is introduced. Therefore, the concentration of the components of inert gas such as Ar gas, and reactive gas such as boron introduced to the impurity layer 66 exceeds $1 \times 10^{20}$ cm$^{-3}$.

In the case of miniature semiconductor, even though a relatively thin and electrically low resistance impurity layer is required, the irradiation of laser beam 31 can meet the requirement. However, due to the abrupt changes in heat during the process, in order to relief the stress caused by the heat change, a Rapid Thermal Process (RTP) is required. Large amount of money is required to carry out this process. However, as mentioned above, from the generation of Ar plasma 65 which composed of inert gas such as Ar gas, once reactive gas such as boron and laser beam 31 is introduced to the surface of the semiconductor substrate 60, annealing effect caused by Ar plasma 65 and laser beam 31 will allow a relatively thin and electrically low resistance impurity layer 66 to form on the surface of the semiconductor substrate at a low cost.

Figure 6B:
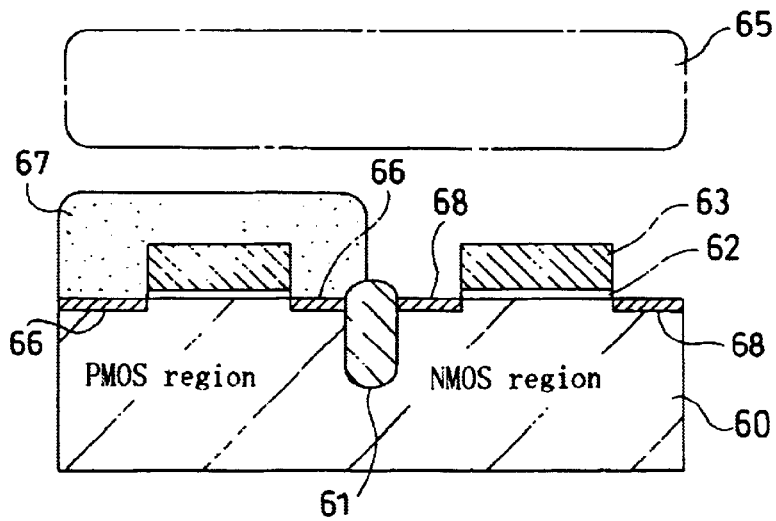

Next, as shown in FIG. 6(b), the first photoresist 64 is removed and a second resist pattern 67 having an opening portion at the NMOS region is formed. After the impurity solid 21 having N type impurity such as arsenic as the main component is disposed on the solid holder 22, an impurity layer 68 of arsenic is formed at the NMOS region of the surface portion of the semiconductor substrate 60 under the conditions similar to those described above.

Figure 7A:
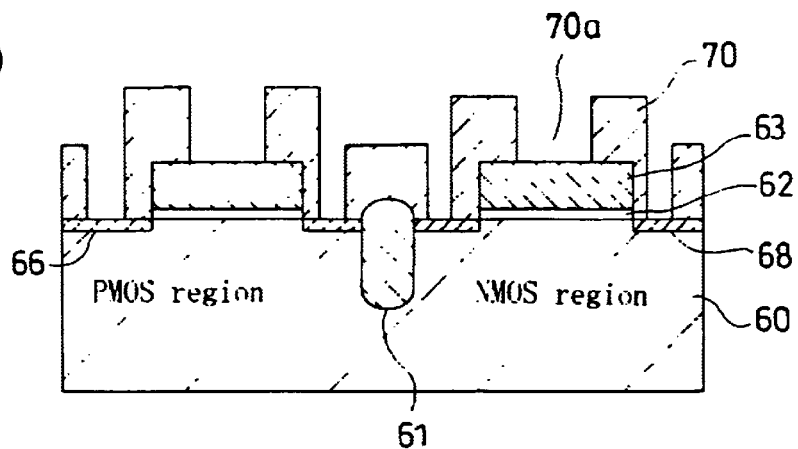
FIGS. 7(a) and (b) are cross sectional views showing respective steps in the method of manufacturing a semiconductor device having a CMOS, achieved by using the impurity introduction method according to the present invention.

Then, referring to FIG. 7(a), an insulating film 70 of a CVD oxide film or the like is deposited on the entire surface of the semiconductor substrate 60 to have the thickness of, for example, 500 nm. Appropriate thermal treatment, for example thermal treatment at the temperature of 1000° C.

for 10 seconds, may be performed for the semiconductor substrate 60 to control the impurity profile of the impurity layers 66 and 68. Thereafter, an opening portion 70a is formed at the insulating film 70 by conducting photolithography and etching processes to the insulating film 70.

Figure 7B:
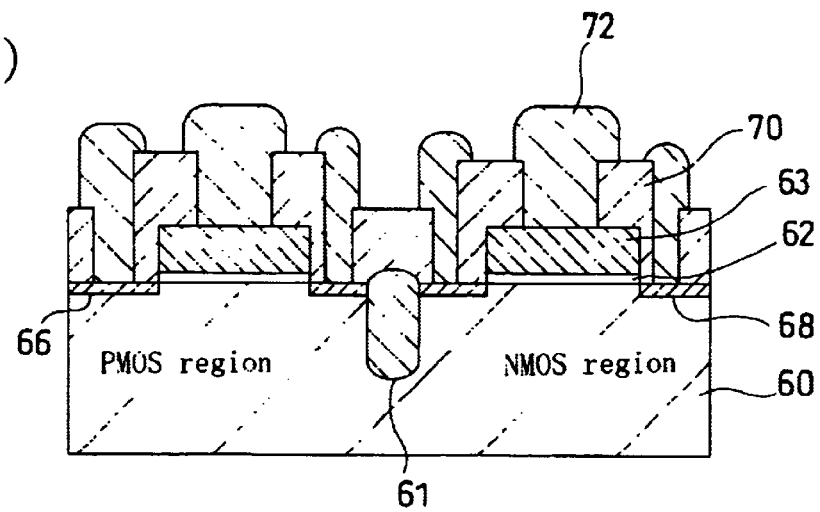
Figure 8:
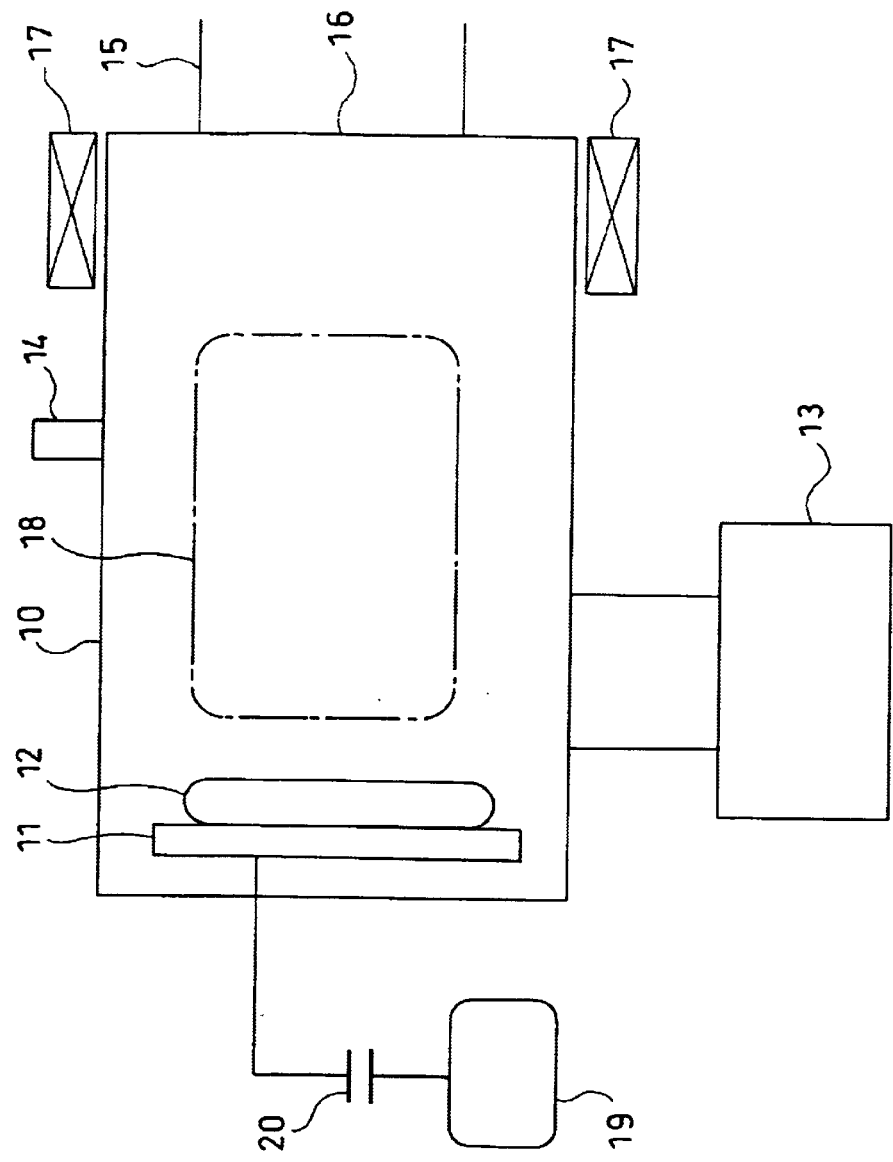
FIG. 8 is a schematic diagram showing a conventional impurity introduction apparatus.
Figure 9:
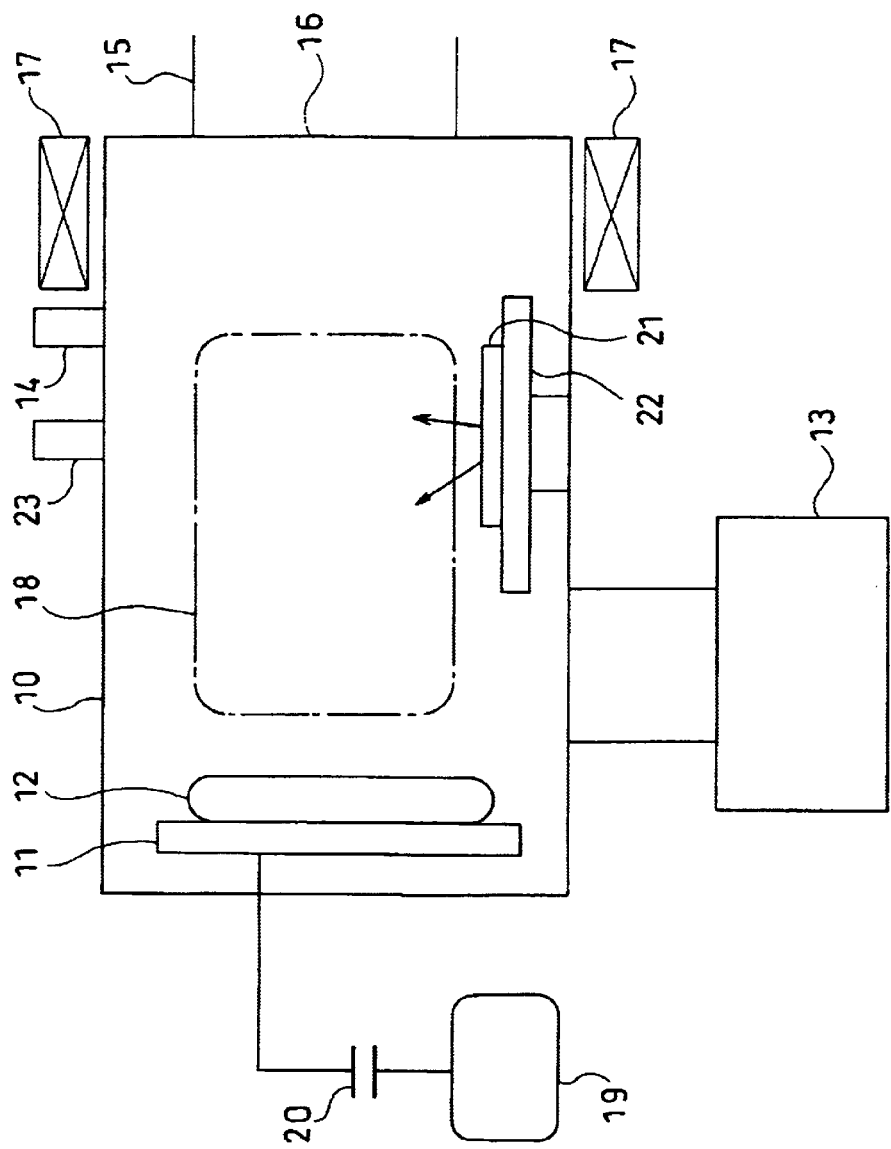
FIG. 9 is a schematic diagram showing an impurity introduction apparatus used as the basis of the present invention.

Next, as shown in FIG. 7(b), a single-layered or multi-layered metal film is deposited on the entire surface, and the metal film is patterned by conducting photolithography and etching processes thereto to form a metal interconnection layer 72.

It should be noted that appropriate impurity profile may be achieved for the impurity layers 66 and 68 forming contact portions by so-called ion implantation in order to keep good electrical contact between the impurity layers 66 and 68 and the metal interconnection layer 72 at the opening portion 70a of the insulating film. In this case, ions of boron or the like can be implanted at the PMOS region with the energy of 15 keV and at the dose of $5 \times 10^{15}/cm^2$, and the ions of arsenic or the like can be implanted at the NMOS region with the energy of 30 keV and at the dose of $3 \times 10^{15}$. It is apparent that these implantation conditions greatly differ depending on the design of the semiconductor device to be manufactured and appropriate setting is required.

It should also be noted that, in the above-described method of manufacturing a semiconductor device having a CMOS, relatively deep and high-concentration impurity layers 66 and 68 can be formed in the vicinity of the surface portion of the semiconductor substrate 60 because the first impurity introduction method is employed: if the second impurity introduction method is employed, shallow and high-concentration impurity layers 66 and 68 can be formed in the vicinity of the surface portion of the semiconductor substrate 60; and if the third impurity introduction method is employed, shallow and low-concentration impurity layers 66 and 68 can be formed in the vicinity of the surface portion of the semiconductor substrate 60.

While boron is introduced as impurity in the respective impurity introduction methods and methods of manufacturing a semiconductor device described above, the impurity to be introduced is not limited to boron, and arsenic, phosphorus, aluminum, antimony or the like can also be introduced. Similarly, while Ar gas is used as inert or reactive gas, such inert or reactive gas is not limited to Ar gas and nitrogen gas or the like can also be employed.

What is claimed is:

1. A method of manufacturing a semiconductor device, comprising the steps of:
    electrically isolating a diode formation region on a semiconductor substrate by an element isolation layer;
    holding, in a vacuum chamber, said semiconductor substrate at which said element isolation layer is formed and an impurity solid including impurity to be introduced into said diode formation region;
    introducing inert or reactive gas into said vacuum chamber, while said impurity solid and said semiconductor substrate are in a state where no voltage is being applied thereto, to generate plasma composed of said inert or reactive gas;
    while maintaining said semiconductor substrate in a state where no voltage is being applied thereto, applying to said impurity solid first voltage which allows said impurity solid to serve as a cathode for said plasma, performing sputtering of said impurity solid by ions in said plasma, and thereby mixing said impurity in said impurity solid into said plasma;
    after resuming said impurity solid back to a state where no voltage is being applied thereto, applying to said semiconductor substrate held in said vacuum chamber a second voltage which allows said semiconductor substrate to serve as a cathode for said plasma to cause a potential difference between said plasma and said semiconductor substrate so that said impurity mixed into said plasma is introduced directly to a surface portion of said diode formation region at said semiconductor substrate to form an impurity layer; and
    forming, on said semiconductor substrate at which said impurity layer is formed, an interconnection layer electrically connected to said impurity layer.

2. The method of manufacturing a semiconductor device of claim 1, wherein said step of introducing said impurity within said plasma onto the surface of the diode formation region of said semiconductor substrate includes, a process of irradiation of a laser beam on said semiconductor substrate.

3. The method of manufacturing a semiconductor device of claim 1, wherein said impurity layer includes components of said inert or reactive gas.

4. The method of manufacturing a semiconductor device of claim 3, wherein concentration of the components of said inert or reactive gas exceeds $1 \times 10^{20}$ cm$^{-3}$.

5. The method of manufacturing a semiconductor device of claim 1, wherein each of said first and second voltages is a negative voltage.

6. The method of manufacturing a semiconductor device of claim 1, wherein said semiconductor substrate is composed of silicon, said impurity is arsenic, phosphorus, boron, aluminum, antimony, gallium, or indium, and said inert or reactive gas is gas including nitrogen or argon.

7. The method of claim 1, wherein said first voltage is supplied from a first power supply and said second voltage is supplied from a second power supply, said first power supply and said second power supply being separate from one another.

8. The method of manufacturing a semiconductor device of claim 1, wherein
    said semiconductor substrate is connected to a first power supply via a first selector switch,
    said first selector switch switches between connecting said semiconductor substrate to ground and to said first power supply,
    said impurity solid is connected to a second power supply via a second selector switch,
    said second selector switch switches between connecting said impurity solid to ground and to said second power supply,
    in the step of generating plasma, said first selector switch and said second selector switch respectively connect said semiconductor substrate and said impurity solid to ground,
    in the step of mixing said impurity in said impurity solid into said plasma, said first selector switch connects said semiconductor substrate to ground while said second selector switch connects said impurity solid to said second power supply,
    in the step of forming said impurity layer, said first selector switch connects said semiconductor substrate to said first power supply while said second selector switch connects said impurity solid to ground.

9. A method of manufacturing a semiconductor device, comprising the steps of:
    electrically isolating a diode formation region on a semiconductor substrate by an element isolation layer;
    holding, in a vacuum chamber, said semiconductor substrate at which said element isolation layer is formed and an impurity solid including impurity to be introduced into said diode formation region;

introducing inert or reactive gas into said vacuum chamber, while said impurity solid and said semiconductor substrate are in a state where no voltage is being applied thereto, to generate plasma composed of said inert or reactive gas;

while maintaining said semiconductor substrate in a state where no voltage is being applied thereto, applying to said impurity solid first voltage which allows said impurity solid to serve as a cathode for said plasma, performing sputtering of said impurity solid by ions in said plasma, and thereby mixing said impurity in said impurity solid into said plasma;

after resuming said impurity solid back to a state where no voltage is being applied thereto, applying to said semiconductor substrate held in said vacuum chamber a second voltage which allows said semiconductor substrate to serve as an anode for said plasma to cause a potential difference between said plasma and said semiconductor substrate so that said impurity mixed into said plasma is introduced directly to a surface portion of said diode formation region at said semiconductor substrate to form an impurity layer; and forming, on said semiconductor substrate at which said impurity layer is formed, an interconnection layer electrically connected to said impurity layer.

10. The method of manufacturing a semiconductor device of claim 9, wherein said step of introducing said impurity within said plasma onto the surface of the diode formation region of said semiconductor substrate includes, a process of irradiation of a laser beam on said semiconductor substrate.

11. The method of manufacturing a semiconductor device of claim 9, wherein said impurity layer includes components of said inert or reactive gas.

12. The method of manufacturing a semiconductor device of claim 11, wherein concentration of the components of said inert or reactive gas exceeds $1 \times 10^{20}$ cm$^{-3}$.

13. The method of manufacturing a semiconductor device of claim 9, wherein said first voltage is a negative voltage.

14. The method of manufacturing a semiconductor device of claim 9, wherein said second voltage is a voltage of 0 V or lower.

15. The method of manufacturing a semiconductor device of claim 9, wherein said semiconductor substrate is composed of silicon, said impurity is arsenic, phosphorus, boron, aluminum, antimony, gallium, or indium, and said inert or reactive gas is gas including nitrogen or argon.

16. The method of claim 9, wherein said first voltage is supplied from a first power supply and said second voltage is supplied from a second power supply, said first power supply and said second power supply being separate from one another.

17. The method of manufacturing a semiconductor device of claim 9, wherein said semiconductor substrate is connected to a first power supply via a first selector switch, said first selector switch switches between connecting said semiconductor substrate to ground and to said first power supply, said impurity solid is connected to a second power supply via a second selector switch, said second selector switch switches between connecting said impurity solid to ground and to said second power supply, in the step of generating plasma, said first selector switch and said second selector switch respectively connect said semiconductor substrate and said impurity solid to ground, in the step of mixing said impurity in said impurity solid into said plasma, said first selector switch connects said semiconductor substrate to ground while said second selector switch connects said impurity solid to said second power supply, in the step of forming said impurity layer, said first selector switch connects said semiconductor substrate to said first power supply while said second selector switch connects said impurity solid to ground.

18. A method of manufacturing a semiconductor device, comprising the steps of:

electrically isolating a diode formation region on a semiconductor substrate by an element isolation layer;

holding, in a vacuum chamber, said semiconductor substrate at which said element isolation layer is formed and an impurity solid including impurity to be introduced into said diode formation region;

introducing inert or reactive gas into said vacuum chamber, while said impurity solid and said semiconductor substrate are in a state where no voltage is being applied thereto, to generate plasma composed of said inert or reactive gas;

while maintaining said semiconductor substrate in a state where no voltage is being applied thereto, applying to said impurity solid first voltage which allows said impurity solid to serve as an anode for said plasma, performing sputtering of said impurity solid by ions in said plasma, and thereby mixing said impurity in said impurity solid into said plasma;

after resuming said impurity solid back to a state where no voltage is being applied thereto, applying to said semiconductor substrate held in said vacuum chamber a second voltage which allows said semiconductor substrate to serve as an anode for said plasma to cause a potential difference between said plasma and said semiconductor substrate so that said impurity mixed into said plasma is introduced directly to a surface portion of said diode formation region at said semiconductor substrate to form an impurity layer; and forming, on said semiconductor substrate at which said impurity layer is formed, an interconnection layer electrically connected to said impurity layer.

19. The method of manufacturing a semiconductor device of claim 18, wherein said step of introducing said impurity within said plasma onto the surface of the diode formation region of said semiconductor substrate includes, a process of irradiation of a laser beam on said semiconductor substrate.

20. The method of manufacturing a semiconductor device of claim 18, wherein said impurity layer includes components of said inert or reactive gas.

21. The method of manufacturing a semiconductor device of claim 20, wherein concentration of the components of said inert or reactive gas exceeds $1 \times 10^{20}$ cm$^{-3}$.

22. The method of manufacturing a semiconductor device of claim 18, wherein each of said first and second voltages is a voltage of 0 V or lower.

23. The method of manufacturing a semiconductor device of claim 18, wherein said semiconductor substrate is composed of silicon, said impurity is arsenic, phosphorus, boron, aluminum, antimony, gallium, or indium, and said inert or reactive gas is gas including nitrogen or argon.

24. The method of claim 18, wherein said first voltage is supplied from a first power supply and said second voltage is supplied from a second power supply, said first power supply and said second power supply being separate from one another.

25. The method of manufacturing a semiconductor device of claim 18, wherein
said semiconductor substrate is connected to a first power supply via a first selector switch,
said first selector switch switches between connecting said semiconductor substrate to ground and to said first power supply,
said impurity solid is connected to a second power supply via a second selector switch,
said second selector switch switches between connecting said impurity solid to ground and to said second power supply,
in the step of generating plasma, said first selector switch and said second selector switch respectively connect said semiconductor substrate and said impurity solid to ground,
in the step of mixing said impurity in said impurity solid into said plasma, said first selector switch connects said semiconductor substrate to ground while said second selector switch connects said impurity solid to said second power supply,
in the step of forming said impurity layer, said first selector switch connects said semiconductor substrate to said first power supply while said second selector switch connects said impurity solid to ground.

26. A method of manufacturing a semiconductor device, comprising the steps of:
electrically isolating a transistor formation region on a semiconductor substrate by an element isolation layer;
forming an electrode at said transistor formation region on said semiconductor substrate at which said element isolation layer is formed, with an insulating layer interposed therebetween;
holding, in a vacuum chamber, said semiconductor substrate at which said electrode is formed and an impurity solid including impurity to be introduced into said transistor formation region;
introducing inert or reactive gas into said vacuum chamber, while said impurity solid and said semiconductor substrate are in a state where no voltage is being applied thereto, to generate plasma composed of said inert or reactive gas;
while maintaining said semiconductor substrate in a state where no voltage is being applied thereto, applying to said impurity solid first voltage which allows said impurity solid to serve as a cathode for said plasma, performing sputtering of said impurity solid by ions in said plasma, and thereby mixing said impurity in said impurity solid into said plasma;
after resuming said impurity solid back to a state where no voltage is being applied thereto, applying to said semiconductor substrate held in said vacuum chamber a second voltage which allows said semiconductor substrate to serve as a cathode for said plasma to cause a potential difference between said plasma and said semiconductor substrate so that said impurity mixed into said plasma is introduced directly to a surface portion of said transistor formation region at said semiconductor substrate to form an impurity layer; and
forming, on said semiconductor substrate at which said impurity layer is formed, an interconnection layer electrically connected to said impurity layer.

27. The method of manufacturing a semiconductor device of claim 26, wherein said step of introducing said impurity within said plasma onto the surface of the diode formation region of said semiconductor substrate includes, a process of irradiation of a laser beam on said semiconductor substrate.

28. The method of manufacturing a semiconductor device of claim 26, wherein said impurity layer includes components of said inert or reactive gas.

29. The method of manufacturing a semiconductor device of claim 28, wherein concentration of the components of said inert or reactive gas exceeds $1 \times 10^{20}$ cm$^{-3}$.

30. The method of manufacturing a semiconductor device of claim 26, wherein each of said first and second voltages is a negative voltage.

31. The method of manufacturing a semiconductor device of claim 26, wherein said semiconductor substrate is composed of silicon, said impurity is arsenic, phosphorus, boron, aluminum, antimony, gallium, or indium, and said inert or reactive gas is gas including nitrogen or argon.

32. The method of claim 26, wherein said first voltage is supplied from a first power supply and said second voltage is supplied from a second power supply, said first power supply and said second power supply being separate from one another.

33. The method of manufacturing a semiconductor device of claim 26, wherein
said semiconductor substrate is connected to a first power supply via a first selector switch,
said first selector switch switches between connecting said semiconductor substrate to ground and to said first power supply,
said impurity solid is connected to a second power supply via a second selector switch,
said second selector switch switches between connecting said impurity solid to ground and to said second power supply,
in the step of generating plasma, said first selector switch and said second selector switch respectively connect said semiconductor substrate and said impurity solid to ground,
in the step of mixing said impurity in said impurity solid into said plasma, said first selector switch connects said semiconductor substrate to ground while said second selector switch connects said impurity solid to said second power supply,
in the step of forming said impurity layer, said first selector switch connects said semiconductor substrate to said first power supply while said second selector switch connects said impurity solid to ground.

34. A method of manufacturing a semiconductor device, comprising the steps of:
electrically isolating a transistor formation region on a semiconductor substrate by an element isolation layer;
forming an electrode at said transistor formation region on said semiconductor substrate at which said element isolation layer is formed, with an insulating layer interposed therebetween;
holding, in a vacuum chamber, said semiconductor substrate at which said electrode is formed and an impurity solid including impurity to be introduced into said transistor formation region;
introducing inert or reactive gas into said vacuum chamber, while said impurity solid and said semiconductor substrate are in a state where no voltage is being applied thereto, to generate plasma composed of said inert or reactive gas;
while maintaining said semiconductor substrate in a state where no voltage is being applied thereto, applying to said impurity solid first voltage which allows said impurity solid to serve as a cathode for said plasma, performing sputtering of said impurity solid by ions in said plasma, and thereby mixing said impurity in said impurity solid into said plasma;

after resuming said impurity solid back to a state where no voltage is being applied thereto, applying to said semiconductor substrate held in said vacuum chamber a second voltage which allows said semiconductor substrate to serve as an anode for said plasma to cause a potential difference between said plasma and said semiconductor substrate so that said impurity mixed into said plasma is introduced directly to a surface portion of said transistor formation region at said semiconductor substrate to form an impurity layer; and forming, on said semiconductor substrate at which said impurity layer is formed, an interconnection layer electrically connected to said impurity layer.

35. The method of manufacturing a semiconductor device of claim 34, wherein said step of introducing said impurity within said plasma onto the surface of the diode formation region of said semiconductor substrate includes, a process of irradiation of a laser beam on said semiconductor substrate.

36. The method of manufacturing a semiconductor device of claim 34, wherein said impurity layer includes components of said inert or reactive gas.

37. The method of manufacturing a semiconductor device of claim 36, wherein concentration of the components of said inert or reactive gas exceeds $1\times10^{20}$ cm$^{-3}$.

38. The method of manufacturing a semiconductor device of claim 34, wherein said first voltage is a negative voltage.

39. The method of manufacturing a semiconductor device of claim 34, wherein said second voltage is a voltage of 0 V or lower.

40. The method of manufacturing a semiconductor device of claim 34, wherein said semiconductor substrate is composed of silicon, said impurity is arsenic, phosphorus, boron, aluminum, antimony, gallium, or indium, and said inert or reactive gas is gas including nitrogen or argon.

41. The method of claim 34, wherein said first voltage is supplied from a first power supply and said second voltage is supplied from a second power supply, said first power supply and said second power supply being separate from one another.

42. The method of manufacturing a semiconductor device of claim 34, wherein said semiconductor substrate is connected to a first power supply via a first selector switch, said first selector switch switches between connecting said semiconductor substrate to ground and to said first power supply, said impurity solid is connected to a second power supply via a second selector switch, said second selector switch switches between connecting said impurity solid to ground and to said second power supply, in the step of generating plasma, said first selector switch and said second selector switch respectively connect said semiconductor substrate and said impurity solid to ground, in the step of mixing said impurity in said impurity solid into said plasma, said first selector switch connects said semiconductor substrate to ground while said second selector switch connects said impurity solid to said second power supply, in the step of forming said impurity layer, said first selector switch connects said semiconductor substrate to said first power supply while said second selector switch connects said impurity solid to ground.

43. A method of manufacturing a semiconductor device, comprising the steps of:

electrically isolating a transistor formation region on a semiconductor substrate by an element isolation layer;

forming an electrode at said transistor formation region on said semiconductor substrate at which said element isolation layer is formed, with an insulating layer interposed therebetween;

holding, in a vacuum chamber, said semiconductor substrate at which said electrode is formed and an impurity solid including impurity to be introduced into said transistor formation region;

introducing inert or reactive gas into said vacuum chamber, while said impurity solid and said semiconductor substrate are in a state where no voltage is being applied thereto, to generate plasma composed of said inert or reactive gas;

while maintaining said semiconductor substrate in a state where no voltage is being applied thereto, applying to said impurity solid first voltage which allows said impurity solid to serve as an anode for said plasma, performing sputtering of said impurity solid by ions in said plasma, and thereby mixing said impurity in said impurity solid into said plasma;

after resuming said impurity solid back to a state where no voltage is being applied thereto, applying to said semiconductor substrate held in said vacuum chamber a second voltage which allows said semiconductor substrate to serve as an anode for said plasma to cause a potential difference between said plasma and said semiconductor substrate so that said impurity mixed into said plasma is introduced directly to a surface portion of said transistor formation region at said semiconductor substrate to form an impurity layer; and forming, on said semiconductor substrate at which said impurity layer is formed, an interconnection layer electrically connected to said impurity layer.

44. The method of manufacturing a semiconductor device of claim 43, wherein said step of introducing said impurity within said plasma onto the surface of the diode formation region of said semiconductor substrate includes, a process of irradiation of a laser beam on said semiconductor substrate.

45. The method of manufacturing a semiconductor device of claim 43, wherein said impurity layer includes components of said inert or reactive gas.

46. The method of manufacturing a semiconductor device of claim 45, wherein concentration of the components of said inert or reactive gas exceeds $1\times10^{20}$ cm$^{-3}$.

47. The method of manufacturing a semiconductor device of claim 43, wherein each of said first and second voltages is a voltage of 0 V or lower.

48. The method of manufacturing a semiconductor device of claim 38, wherein said semiconductor substrate is composed of silicon, said impurity is arsenic, phosphorus, boron, aluminum, antimony, gallium, or indium, and said inert or reactive gas is gas including nitrogen or argon.

49. The method of claim 43, wherein said first voltage is supplied from a first power supply and said second voltage is supplied from a second power supply, said first power supply and said second power supply being separate from one another.

50. The method of manufacturing a semiconductor device of claim 43, wherein said semiconductor substrate is connected to a first power supply via a first selector switch, said first selector switch switches between connecting said semiconductor substrate to ground and to said first power supply, said impurity solid is connected to a second power supply via a second selector switch, said second selector switch switches between connecting said impurity solid to ground and to said second power supply, in the step of generating plasma, said first selector switch and said second selector switch respectively connect said semiconductor substrate and said impurity solid to ground, in the step of mixing said impurity in said impurity solid into said plasma, said first selector switch connects said semiconductor substrate to ground while said second selector switch connects said impurity solid to said second power supply, in the step of forming said impurity layer, said first selector switch connects said semiconductor substrate to said first power supply while said second selector switch connects said impurity solid to ground.

* * * * *

UNITED STATES PATENT AND TRADEMARK OFFICE
CERTIFICATE OF CORRECTION

PATENT NO. : 6,784,080 B2
DATED : August 31, 2004
INVENTOR(S) : Bunji Mizuno et al.

It is certified that error appears in the above-identified patent and that said Letters Patent is hereby corrected as shown below:

Title page,
Item [54], Title, change the last two words from "SPUTTER DOPING" to
-- SPUTTER-DOPING --

Signed and Sealed this

Twenty-sixth Day of April, 2005

JON W. DUDAS
*Director of the United States Patent and Trademark Office*